(12) United States Patent
Meiser et al.

(10) Patent No.: US 9,324,829 B2
(45) Date of Patent: Apr. 26, 2016

(54) METHOD OF FORMING A TRENCH ELECTRODE DEVICE WITH WIDER AND NARROWER REGIONS

(71) Applicant: Infineon Technologies AG, Neubiberg (DE)

(72) Inventors: Andreas Meiser, Sauerlach (DE); Till Schloesser, Munich (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 101 days.

(21) Appl. No.: 13/850,037

(22) Filed: Mar. 25, 2013

(65) Prior Publication Data

US 2013/0230956 A1 Sep. 5, 2013

Related U.S. Application Data

(63) Continuation-in-part of application No. 13/241,771, filed on Sep. 23, 2011.

(51) Int. Cl.
*H01L 21/336* (2006.01)
*H01L 29/66* (2006.01)
(Continued)

(52) U.S. Cl.
CPC .... *H01L 29/66477* (2013.01); *H01L 21/76898* (2013.01); *H01L 23/481* (2013.01); *H01L 29/4236* (2013.01); *H01L 29/4238* (2013.01); *H01L 29/66734* (2013.01); *H01L 29/7397* (2013.01); *H01L 29/7811* (2013.01); *H01L 29/7813* (2013.01); *H01L 29/407* (2013.01); *H01L 29/42368* (2013.01); *H01L 2924/0002* (2013.01)

(58) Field of Classification Search
CPC .............. H01L 29/7813; H01L 29/407; H01L 29/4236; H01L 29/66734; H01L 29/41766
USPC .......................................................... 438/270
See application file for complete search history.

(56) References Cited

U.S. PATENT DOCUMENTS

| 5,321,289 | A | 6/1994 | Baba et al. |
| 5,578,522 | A | 11/1996 | Nakamura et al. |

(Continued)

FOREIGN PATENT DOCUMENTS

| CN | 101364613 A | 2/2009 |
| CN | 102099919 A | 6/2011 |

(Continued)

*Primary Examiner* — Jay C Kim
*Assistant Examiner* — David Chen
(74) *Attorney, Agent, or Firm* — Murphy, Bilak & Homiller, PLLC

(57) ABSTRACT

A method includes forming a trench extending from a first surface of a semiconductor body into the semiconductor body such that a first trench section and at least one second trench section adjoin the first trench section, wherein the first trench section is wider than the second trench section. A first electrode is formed, in the at least one second trench section, and dielectrically insulated from semiconductor regions of the semiconductor body by a first dielectric layer. An inter-electrode dielectric layer is formed, in the at least one second trench section, on the first electrode. A second electrode is formed, in the at least one second trench section on the inter-electrode dielectric layer, and in the first trench section, such that the second electrode at least in the first trench section is dielectrically insulated from the semiconductor body by a second dielectric layer.

14 Claims, 19 Drawing Sheets

(51) Int. Cl.
*H01L 23/48* (2006.01)
*H01L 29/423* (2006.01)
*H01L 21/768* (2006.01)
*H01L 29/739* (2006.01)
*H01L 29/78* (2006.01)
*H01L 29/40* (2006.01)

(56) References Cited

U.S. PATENT DOCUMENTS

| 5,945,708 | A | 8/1999 | Tihanyi |
| 2003/0178673 | A1 | 9/2003 | Bhalla et al. |
| 2006/0076660 | A1 | 4/2006 | Boschlin et al. |
| 2006/0273386 | A1* | 12/2006 | Yilmaz et al. ............ 257/330 |
| 2009/0218618 | A1* | 9/2009 | Blank et al. ............ 257/331 |
| 2009/0224313 | A1 | 9/2009 | Burke |
| 2011/0127603 | A1* | 6/2011 | Burke et al. ............ 257/331 |
| 2012/0012924 | A1 | 1/2012 | Meiser |
| 2012/146130 | A1 | 6/2012 | Hirler |
| 2013/0099308 | A1 | 4/2013 | Gruber et al. |

FOREIGN PATENT DOCUMENTS

| DE | 19638438 A1 | 4/1998 |
| DE | 102006046869 A1 | 4/2008 |
| DE | 112009001714 T5 | 6/2011 |
| DE | 102012216969 A1 | 3/2013 |

\* cited by examiner

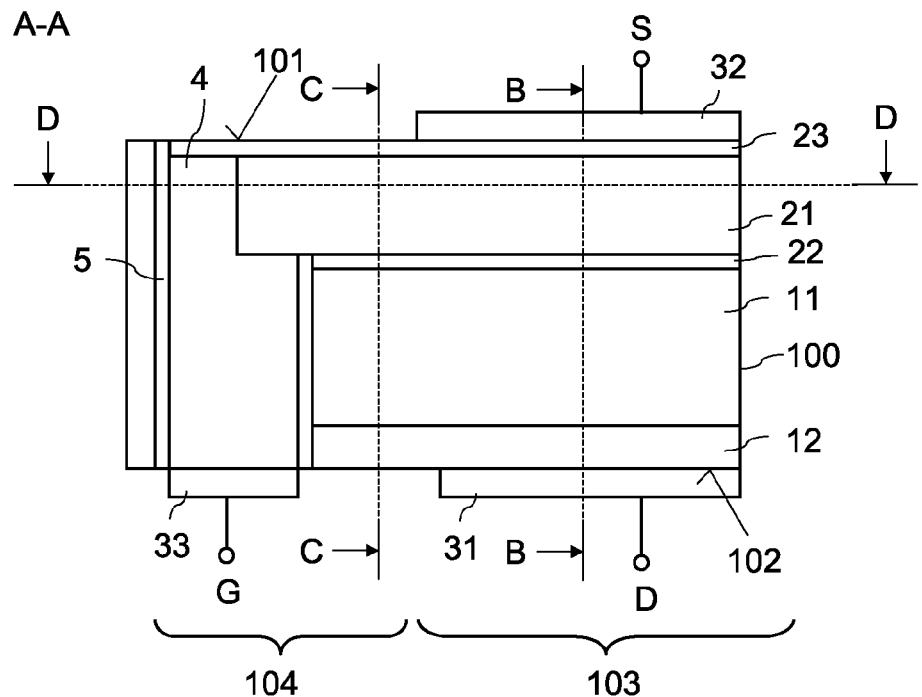
FIG 1A
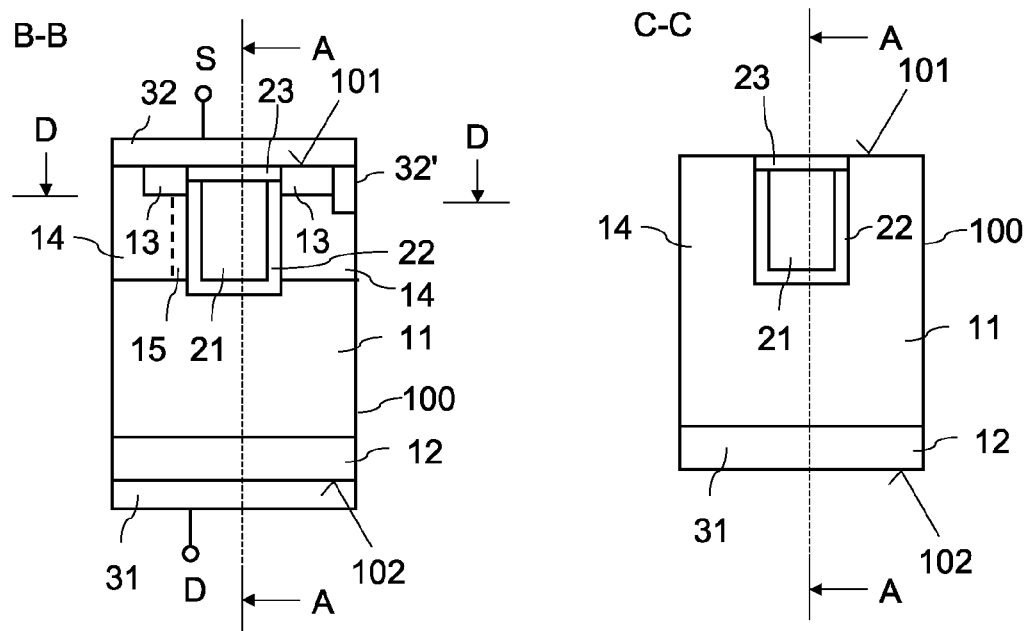
FIG 1B
FIG 2

METHOD OF FORMING A TRENCH ELECTRODE DEVICE WITH WIDER AND NARROWER REGIONS

PRIORITY CLAIM

This application is a Continuation-In-Part (CIP) of U.S. patent application Ser. No. 13/241,771, filed on 23 Sep. 2011, the content of said application incorporated herein by reference in its entirety.

TECHNICAL FIELD

Embodiments of the present invention relate to a method for producing a semiconductor device, in particular a semiconductor device including a trench electrode arrangement, such as a trench transistor device.

BACKGROUND

A trench transistor device, such as a trench MOSFET (metal oxide semiconductor field effect transistor) or a trench IGBT (insulated gate bipolar transistor), is a vertical transistor device that includes a semiconductor body with a first and a second surface in which at least one source region, at least one body region, a drift region, and a drain region are integrated. In an IGBT the source and drain regions are also referred to as emitter regions, and the body and drift regions are also referred to as base regions.

Usually, the source region and the body region are integrated in the region of the first surface while the drain region is integrated in the region of the second surface and separated from the body region by the drift region. At least one gate electrode, which serves to switch the component on and off, is arranged in a trench of the semiconductor body in the region of the first surface. The source region is electrically contacted by a source electrode which is usually arranged above the first surface and which is electrically insulated from a gate terminal (gate pad), with the latter contacting the gate electrode. The drain region is electrically contacted by a drain electrode which is usually arranged above the second surface.

Vertical transistor components of this kind can be mounted on a carrier with their second surface facing towards the carrier. In such an arrangement the carrier can serve as a drain terminal of the transistor component and can further serve as a cooling element for dissipating heat generated in the semiconductor body. When the vertical transistor element is operated as a switch, heat is mainly generated in its active regions, like body and drift regions. Since these active regions are arranged close to the first surface while the cooling element is arranged on the second surface, there is a relatively high thermal resistance resulting from those regions of the semiconductor body which are arranged between the pn-junction and the second surface. The thermal resistance could be reduced by arranging a cooling element on the first surface. However, such cooling element would short-circuit the gate and the source electrode which are both arranged at the first surface.

There is, therefore, a need for a semiconductor device which has better properties in terms of dissipating heat from the semiconductor component.

SUMMARY

In an embodiment, a method for producing a semiconductor device is provided. The method includes forming a trench extending from a first surface of a semiconductor body into the semiconductor body such that the trench has a first trench section and at least one second trench section adjoining the first trench section, wherein the trench is wider in the first trench section than in the second trench section; forming, in the at least one second trench section, a first electrode dielectrically insulated from semiconductor regions of the semiconductor body by a first dielectric layer; forming, in the at least one second trench section, an inter-electrode dielectric layer on the first electrode; and forming a second electrode in the at least one second trench section on the inter-electrode dielectric layer, and in the first trench section, such that the second electrode at least in the first trench section is dielectrically insulated from semiconductor regions of the semiconductor body by a second dielectric layer.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes FIGS. 1A and 1B illustrates a first embodiment of a trench transistor device including a semiconductor via;

FIG. 2 illustrates a vertical cross sectional view of the transistor device of FIGS. 1A and 1B according to one embodiment;

FIG. 7 which includes

FIG. 8 which includes

FIG. 9 which includes

FIG. 10 which includes FIGS. 10A to 10C illustrates horizontal cross sectional views of the semiconductor via according to a first and a second embodiment;

FIG. 12 which includes

FIG. 13 which includes

FIG. 14 which includes

FIG. 18 which includes

DETAILED DESCRIPTION

Figure 3:
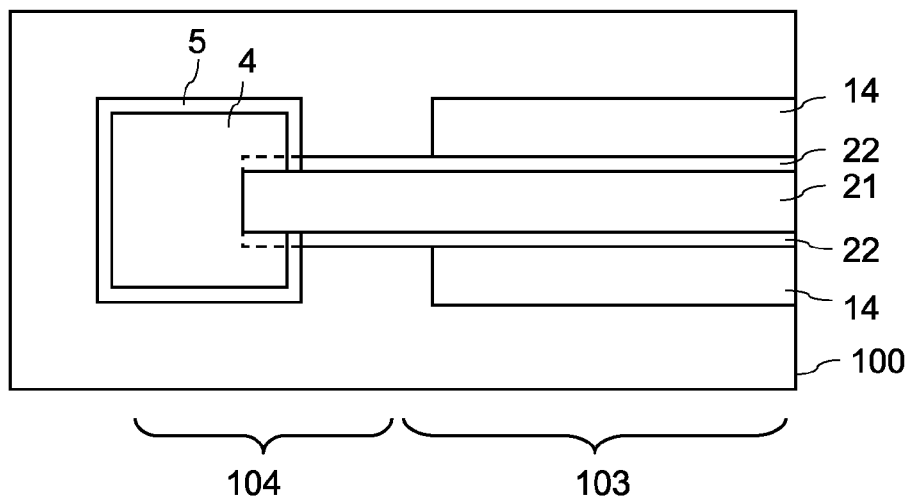
FIG. 3 illustrates a horizontal cross sectional view of the transistor device of FIGS. 1A and 1B according to a first embodiment.

FIGS. 1A and 1B schematically illustrate a first embodiment of a vertical transistor device, specifically of a trench transistor device. The transistor device includes a semiconductor body 100 with a first surface 101 and a second surface 102. FIGS. 1A and 1B each show vertical cross sectional views of the semiconductor body 100, where FIG. 1A shows the semiconductor body 100 in a first vertical section plane A-A and FIG. 1B shows a vertical cross sectional view in a second vertical section plane B-B. These vertical section planes A-A, B-B extend perpendicular to the first and second surfaces 101, 102 of the semiconductor body 100. FIGS. 1A and 1B each only show a section of the semiconductor body 100.

Referring to FIG. 1A, the transistor device includes a semiconductor via 4 that extends within the semiconductor body 100 in a vertical direction of the semiconductor body 100 to the second surface 102. A "vertical direction" of the semiconductor body 100 is a direction perpendicular to the first and second surfaces 101, 102. The semiconductor via 4 is electrically insulated from the surrounding semiconductor body 100 by a via insulation layer 5. The via insulation layer 5 includes, for example, a conventional electrically or dielectrically insulating material, such as an oxide, a nitride, or the like. The via insulation layer 5 could also be implemented as a composite layer including a plurality of different electrically insulating layers.

The semiconductor via 4 is electrically connected to a gate connection electrode 33 in the region of the second surface 102 of the semiconductor body 100. The gate connection electrode 33 forms a gate terminal G or is electrically connected to a gate terminal G of the transistor device. The semiconductor via 4 electrically connects the gate terminal G to a gate electrode 21 of the transistor device.

The gate electrode 21 is at least partially arranged in a trench that extends in a vertical direction of the semiconductor body 100 from the first surface 101. This trench and, therefore, the gate electrode 21 has a longitudinal direction, where FIG. 1A shows a vertical cross sectional view along the longitudinal direction, and FIG. 1B shows a vertical cross sectional view in an section plane perpendicular to the longitudinal direction. Referring to FIG. 1A the trench with the gate electrode 21 extends in a first lateral direction of the semiconductor body 100 through the via insulation layer 5 into the semiconductor via 4. The gate electrode 21 adjoins the semiconductor via 4 so as to be electrically connected to the semiconductor via 4. The gate electrode 21 may include a conventional gate electrode material, such as a metal or a polycrystalline semiconductor material, such as polysilicon.

The gate electrode 21 is dielectrically insulated from the semiconductor body 100 by a gate dielectric 22. The gate dielectric 22 may include a conventional gate dielectric material, such as a thermally grown or a deposited oxide.

In the embodiment illustrated in FIG. 1A, the gate electrode 21 adjoins the semiconductor via 4 at a bottom and a sidewall of the trench in which it is implemented. However, this is only an example. According to a further embodiment (not illustrated), the gate electrode 21 adjoins the semiconductor via 4 only at the sidewall of the trench or at the bottom of the trench.

Referring to FIG. 1B the transistor device further includes a drift region 11, a drain region 12, a source region 13 and a body region 14. The source region 13 is arranged in the region of the first surface 101 and is electrically connected to a source electrode 32 arranged on the first surface 101. The drain region 12 is arranged in the region of the second surface 102 and is electrically connected to a drain electrode 31 arranged on the second surface 102. The body region 14 adjoins the source region 13 and the drift region 11 and is arranged between the source region 13 and the drift region 11. The drift region 11 may adjoin the drain region 12 (as illustrated). According to a further embodiment, a field stop region of the same doping type as the drift region 11 is arranged between the drift region 11 and the drain region 12. Doping concentrations of the individual semiconductor regions are, for example, as follows: drift region 11: $10^{14}$ cm$^{-3}$ to $10^{17}$ cm$^{-3}$; source region 13 and drain region 12: $10^{19}$ cm$^{-3}$ to $10^{21}$ cm$^{-3}$; body region 14: $10^{16}$ cm$^{-3}$ to $10^{18}$ cm$^{-3}$.

Referring to FIG. 1B, the gate electrode 21 extends from the source region 13 through the body region 14 to or into the drift region 11 and is dielectrically insulated from these semiconductor regions by the gate dielectric 22. An insulation layer 23 arranged above the gate electrode 21 separates the gate electrode 21 from the source electrode 32. The source electrode 32 is also electrically connected to the body region 14. For this, the body region 14 may include a body region section that extends to the first surface 101. This is illustrated in the left section of FIG. 1B. According to further embodiments, the source electrode 32 includes an electrode section 32' that extends through the source region 13 into the body region 14. This is illustrated in the right section of FIG. 1B.

Referring to FIG. 1A the semiconductor body 100 includes a transistor cell region 103 and a gate connection region 104. In the transistor cell region 103 at least one transistor cell is arranged. One transistor cell includes a longitudinal gate electrode 21 and source and body regions 13, 14 arranged on both sides of the longitudinal gate electrode 21. FIG. 1B shows a vertical cross section through one transistor cell. (It should be noted in this connection that an arrangement as illustrated in FIG. 1B could also be considered to include two transistor cells.)

The gate connection region 104 includes the semiconductor via 4, the via insulation layer 5 and a section of the gate electrode 21 extending from the transistor cell region 103 to or into the semiconductor via 4. While in the embodiment illustrated in FIG. 1A, the gate electrode 21 extends into the semiconductor via 4, it would also be sufficient for the gate electrode 21 to only extend through the via insulation layer to the semiconductor via 4.

Referring to FIG. 2, which illustrates a vertical cross sectional view of the semiconductor body 100 in a vertical section plane C-C that is arranged in the connection region 104 and that extends perpendicular to the longitudinal direction of the gate electrode 21, source and body regions can be omitted in the connection region 104 between the semiconductor via 4 and the transistor cell region 103.

A plurality of different implementations of the transistor cell region 103 and the semiconductor via 4 are possible. For explanation purposes, four different implementations are explained with reference to FIGS. 3 to 6. Each of these Figures illustrates a horizontal cross sectional view of the semiconductor body 100 in a horizontal section plane D-D illustrated in FIGS. 1A and 1B.

Referring to FIG. 3 only one transistor cell with a gate electrode 21 arranged in one trench is arranged in the transistor cell region 103.

Figure 4:
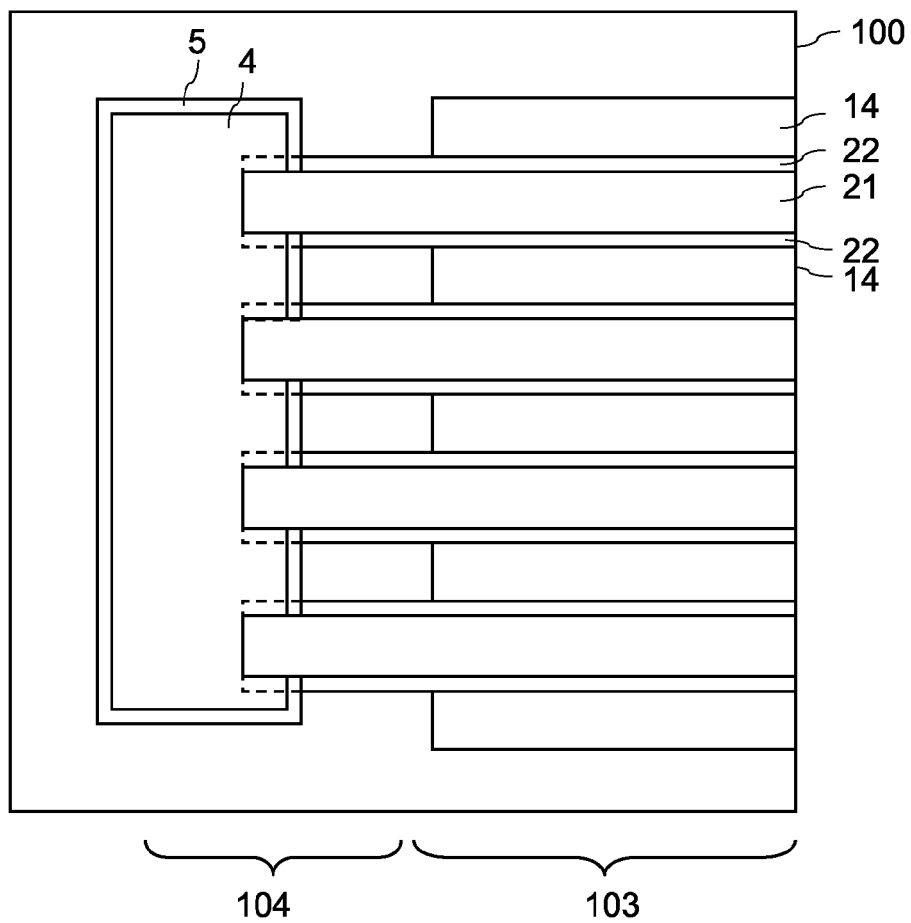
FIG. 4 illustrates a horizontal cross sectional view of the transistor device of FIGS. 1A and 1B according to a second embodiment.

Referring to FIG. 4 a plurality of transistor cells are arranged in the transistor cell region 103, where each of these transistor cells includes one section of the gate electrode 21 arranged in a longitudinal trench. Each of these sections of the gate electrode 21 extends in the first lateral direction through the via insulation layer 5 into the semiconductor via 4, is electrically connected to the semiconductor via 4, and is electrically connected to the gate terminal G through the semiconductor via 4. Since the semiconductor via 4 electrically connects each of the sections of the gate electrode 21 to the gate terminal G no connections are required that electrically connect the individual sections of the gate electrode 21 with each other.

Implementing the individual transistor cells with longitudinal gate electrodes or longitudinal gate electrode sections is only an example. According to a further embodiment, illustrated in FIG. 5, the gate electrode 21 is grid-shaped and has sections that extend through the via insulation layer 5 into the semiconductor via 4. In the embodiment illustrated in FIG. 5, the grid of the gate electrode 21 is a rectangular grid. However, this is only an example. The gate electrode 21 could also be implemented with any other type of grid, such as a hexagonal grid.

Figure 5:
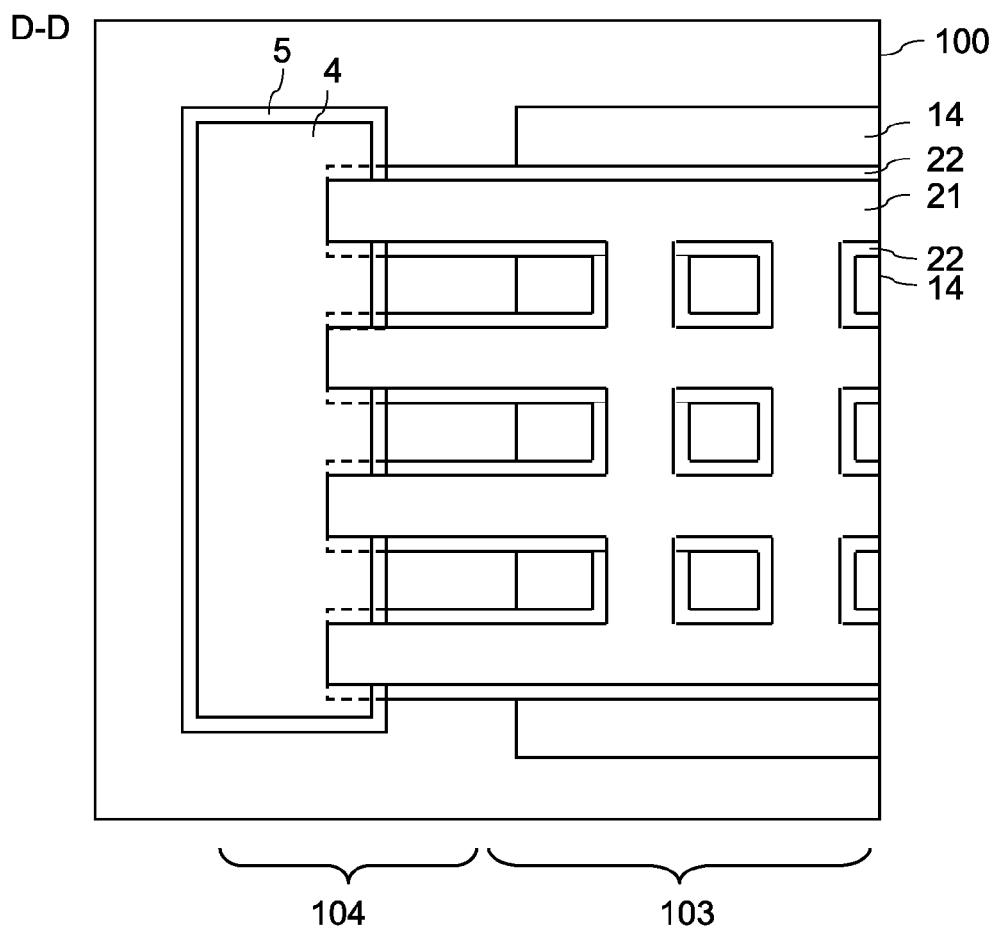
FIG. 5 illustrates a horizontal cross sectional view of the transistor device of FIGS. 1A and 1B according to a third embodiment.

In the transistor devices according to FIGS. 3 to 5 only one lateral end of the gate electrode 21 or the sections of the gate electrode 21 are illustrated. On opposite lateral ends a further semiconductor via 4 may be arranged that is connected to the lateral ends of the gate electrode 21 or the sections of the gate electrode 21, so that the transistor device in this case includes two semiconductor vias 4. These two semiconductor vias 4 are electrically connected to a common gate terminal G. However, it is also possible to provide a semiconductor via only at one lateral end of the gate electrode 21.

Figure 6:
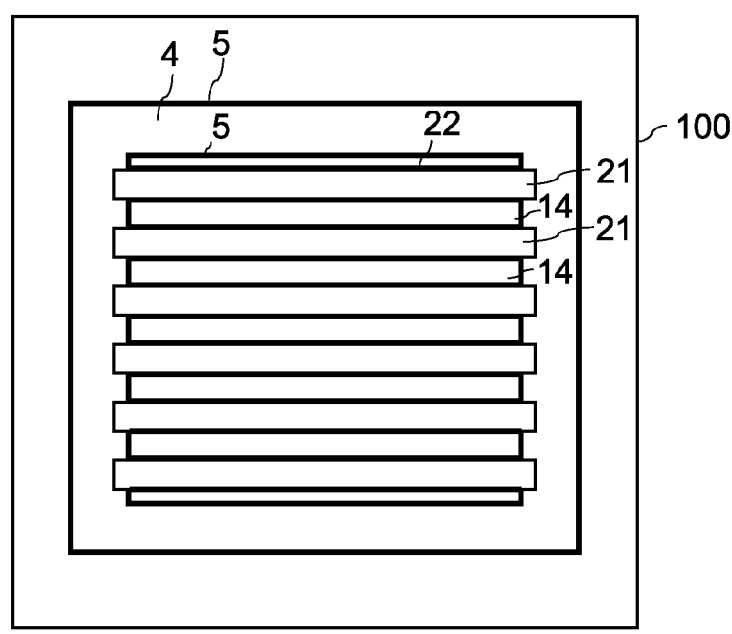
FIG. 6 illustrates a horizontal cross sectional view of the transistor device of FIGS. 1A and 1B according to a fourth embodiment.

Referring to a further embodiment illustrated in FIG. 6, the semiconductor via 4 surrounds the transistor cell region 103 and is electrically connected to the sections of the gate electrode 21 at both lateral ends of these longitudinal sections of the gate electrode 21. FIG. 6 schematically illustrates a horizontal cross sectional view of the transistor device in a smaller scale compared with the horizontal cross sectional views illustrated in FIGS. 3 to 5. The gate dielectric 22 and the via insulation layer 5 are illustrated as bold lines in FIG. 6.

Figure 7A:
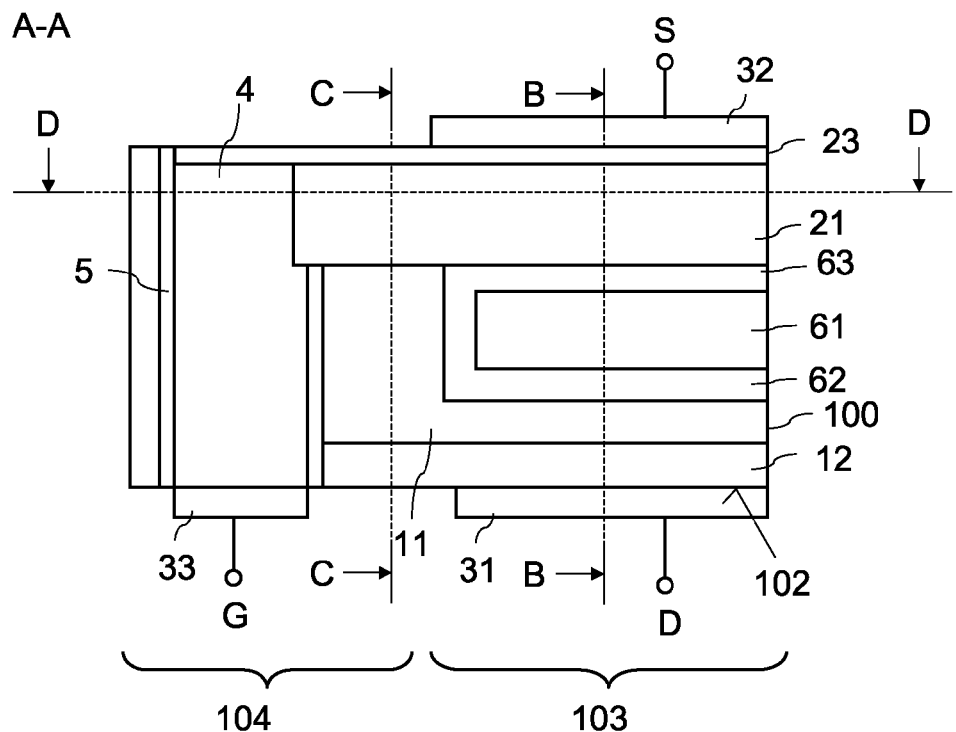
FIGS. 7A to 7C illustrates a further embodiment of a transistor device with a semiconductor via.
Figure 7B:
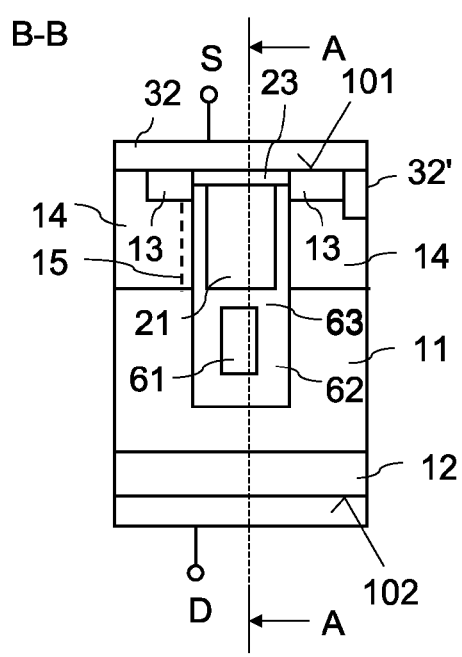
Figure 7C:
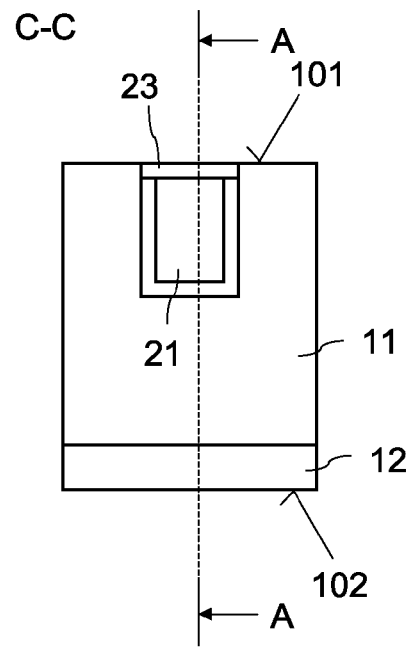

FIGS. 7A to 7C illustrate vertical cross sectional views of a trench transistor device according to a further embodiment. FIG. 7A shows the transistor device in a first vertical section plane A-A, FIG. 7B shows the transistor device in a second vertical section plane B-B, and FIG. 7C shows the transistor device in a third vertical section plane C-C. These section planes A-A, B-B, C-C correspond to the section planes explained with reference to FIGS. 1A, 1B and 2.

Referring to FIGS. 7A and 7B, the transistor device includes a field electrode 61 arranged in the same at least one trench as the gate electrode 21 and below the gate electrode 21. Basically, the geometry of the field electrode 61 corresponds to the geometry of the gate electrode 21, so that dependent on the form of the gate electrode 21 the field electrode 61 may include a plurality of longitudinal field electrode sections or may have a grid-shaped geometry.

The field electrode 61 is dielectrically insulated from the semiconductor body 100 by a field electrode dielectric 62 and is dielectrically insulated from the gate electrode 21 by a further dielectric layer 63. This further dielectric layer 63 will be referred to as inter-electrode dielectric 63 in the following. According to one embodiment, the field electrode 61 is electrically connected to the source electrode 32. For this, the field electrode 61 may include sections that in a vertical direction of the semiconductor body 100 extend to the source electrode 32 and are dielectrically insulated from the gate electrode 21. However, these sections are not explicitly illustrated in FIGS. 7A to 7C. According to a further embodiment, the inter-electrode dielectric 63 is omitted. In this case, the field electrode 61 is electrically connected to the gate electrode 21. Referring to FIG. 7B the field electrode dielectric 62 is thicker than the gate dielectric 22.

In the embodiment illustrated in FIG. 7A, the field electrode 61 is only arranged in the transistor cell region 103 and, therefore, does not extend to the semiconductor via 4 in the first lateral direction. This is also illustrated in FIG. 7C, which illustrates a vertical cross sectional view of the transistor device in the gate connection region 104.

The operating principle of the transistor device corresponds to the operating principle of a conventional transistor device, in particular a conventional MOSFET or a conventional IGBT. Since the drain electrode 31 and the gate connection electrode 33 are arranged on the same surface of the semiconductor body 100, namely the second surface 102, while only the source electrode 32 is arranged on the first surface 101, the source electrode 32 can be mounted to a cooling element (not shown) which allows to efficiently cool the semiconductor device during operation. In operation of the semiconductor device most of the energy that is dissipated in the transistor device is dissipated at a pn-junction between the body region 14 and the drift region 11 which is close to the first surface 101. By mounting the source electrode 32 to a cooling element (not shown), the heat generated at the pn-junction can be efficiently removed from the semiconductor body 100.

The transistor device can be implemented as any conventional type of MOSFET or IGBT, where the type of transistor device is dependent on the doping types of the individual semiconductor regions. In an n-type MOSFET the source region 13, the drift region 11 and the drain region 12 are n-doped and the body region 11 is p-doped, while in a p-type MOSFET the source region 13, the drift region 11 and the drain region 12 are p-doped, while the body region 14 is n-doped. In an IGBT the doping type of the drain region 12 is complementary to the drift region 11. The transistor can be implemented as an enhancement MOSFET. In this case, the body region 14 which is doped complementarily to the source region 13 and the drift region 11 adjoins the gate dielectric 22. The transistor could also be implemented as a depletion transistor. In this case, a channel region of the same doping type as the source region 13 and the drift region 11 extends along the gate dielectric 22 between the source region 13 and the drift region 11. This channel region 15 is illustrated in dashed lines in FIGS. 1B and 7B.

FIGS. 1A and 1B and FIGS. 7A and 7C schematically illustrate different embodiments of a transistor device. These figures basically illustrate different embodiments of the transistor device, where specific geometries or dimensions of electrodes, dielectric layers and semiconductor regions illustrated in these Figures may, of course, vary. In particular, the specific geometry of the gate electrode 21 and the field electrode 61 may vary dependent on the specific method employed for producing the transistor device.

Figure 8A:
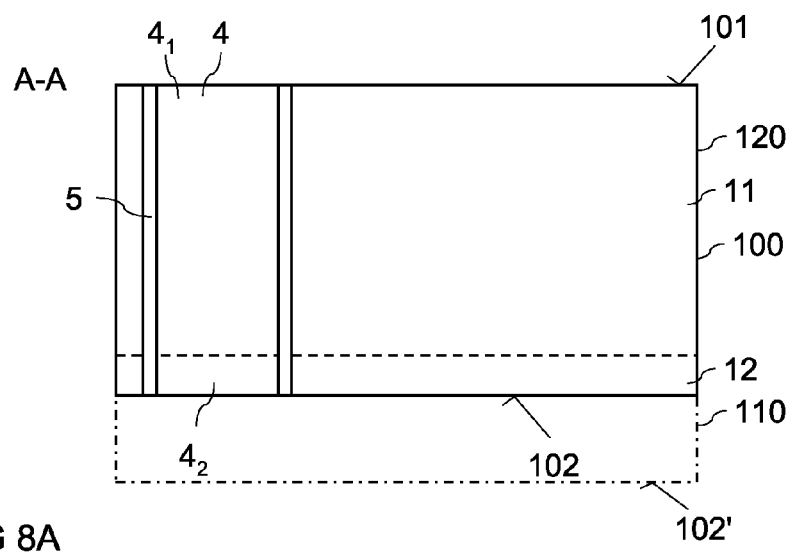
FIGS. 8A to 8C illustrates a method for producing a vertical transistor device according to a first embodiment.
Figure 8B:
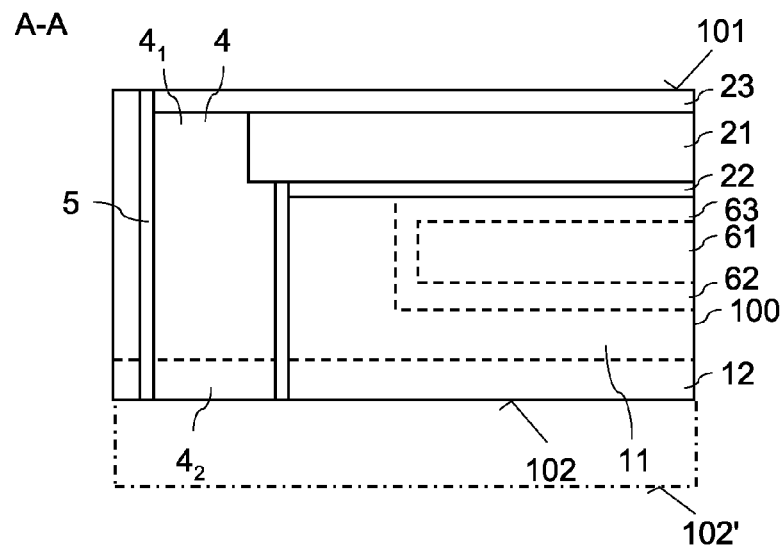
Figure 8C:
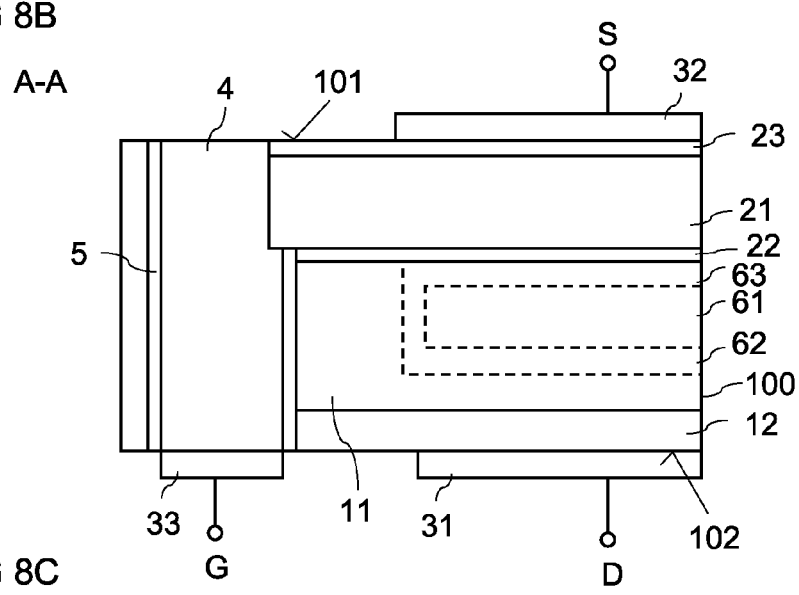

FIGS. 8A to 8C illustrate an embodiment of a method for producing a transistor device as explained herein before. This method for producing the vertical trench transistor device with the drain electrode 31 and the gate connection electrode 33 on the second surface 102 and the source electrode 32 of the first surface 101 includes three main process sequences (method step sequences). The results of these three main process sequences are illustrated in FIGS. 8A to 8C which each illustrate a horizontal cross sectional view of the semiconductor body 100 in a vertical section plane that corresponds to section plane A-A illustrated in FIGS. 1A and 7A.

Referring to FIG. 8A, a first process sequence includes forming the semiconductor via 4 surrounded by the via insulation layer 5 in the semiconductor body 100. Embodiments of methods for producing the semiconductor via 4 in the semiconductor body 100 are explained with reference to FIGS. 9A to 9C, 10A, 10B, 11 and 12 below. Referring to FIG. 8A, the semiconductor via 4 can be produced to extend completely through the semiconductor body 100, which means from the first surface 101 to the second surface 102 and surrounded by the via insulation layer 5 within the semiconductor body 100. Referring to what is illustrated in dashed and dotted lines in FIG. 8A, the semiconductor via can be produced such that it first only extends from the first surface 101 into the semiconductor body 100 but does not completely extend through the semiconductor body 100. At this stage of the manufacturing process a second surface 102' of the semiconductor body 100 is not yet the final second surface 102 of the transistor device. Later in the manufacturing process parts of the semiconductor body 100 are removed at the second surface 102', so as to uncover the semiconductor via 4 at the second surface 102. This removal process may include an etching process and/or a polishing process, such as a chemical polishing process, a mechanical polishing process or a chemical-mechanical polishing process (CMP).

The semiconductor via is, for example, produced by forming the via insulation layer 5 that extends into the semiconductor body 100 from the first surface 101. The via insulation layer 5 separates the semiconductor body 100 into the semiconductor via 4 and remaining regions of the semiconductor body 100, where in the remaining regions of the semiconductor body 100 the at least one transistor cell of the transistor device is implemented.

Referring to FIG. 8A the semiconductor body 100 may include two differently doped semiconductor layers, namely a first semiconductor layer 110 and a second semiconductor layer 120. The first semiconductor layer 110 is, for example, a semiconductor substrate, while the second semiconductor layer 120 is, for example, an epitaxial layer. According to one embodiment, the first semiconductor layer 110 forms the drain region 12 of the transistor device, while the drift region 11, the source and body regions 13, 14 and the gate electrode 21 with the gate dielectric 22 are implemented in the second semiconductor layer 120. The second semiconductor layer 120 has a basic doping concentration that is lower than the basic doping concentration of the first semiconductor layer 110, where those regions of the second semiconductor layer 120 that keep the basic doping concentration in subsequent process steps form the drift region 11 of the transistor device. When the semiconductor body 100 includes two differently doped semiconductor layers 110, 120, the semiconductor via 4 includes two differently doped via sections, namely a first via section $4_1$ adjacent to the first surface 101 and having a doping concentration corresponding to the doping concentration of the second layer 120, and a second via section $4_2$ which is finally adjacent to the second surface 102 and connected to the gate connection electrode 33. The second via section $4_2$ has a doping concentration that corresponds to the doping concentration of the first layer 110.

Referring to FIG. 8B a second process sequence includes forming the gate electrode 21 and the gate dielectric 22 as well as the optional field electrode 61 with the field electrode dielectric 62 and the inter-electrode dielectric 63. This process sequence further includes forming the insulation layer 23 on top of the gate electrode 21 which insulates the gate electrode 21 from the source electrode 32.

Referring to FIG. 8C, a third process sequence includes forming the source and body regions (out of view in FIG. 8C), forming the source electrode 32 on the first surface 101, and the drain electrode 31 and the gate connection electrode 33 on the second surface 102. When the semiconductor via 4 has been produced to not completely extend through the semiconductor body 100 (as illustrated in dashed and dotted lines in FIG. 8A), a removal process is performed before producing the drain electrode 31 and the gate connection electrode 33. In this removal process parts of the semiconductor body 100 are removed in order to uncover the semiconductor via 4 at the second surface 102. Forming the electrodes, such as the source electrode 32, the gate electrode 33 and the drain electrode 31 may, in particular, include the deposition of an intermediate dielectric layer on the first and/or second surface 101, 102 of the semiconductor body 100, forming contact holes in the intermediate dielectric layer that extend through the intermediate dielectric layer to those regions that are to be contacted by the respective electrode, such as the source regions 13, the drain region 12 and the semiconductor via 4, and depositing an electrode material on the intermediate dielectric that fills the contact hole, so as to form the electrode. The electrode material is, e.g., a metal, such as copper, aluminum, tungsten, etc. In the drawings, however, the electrodes 31, 32, 33 are only schematically shown so that these intermediate dielectrics are not illustrated.

One embodiment of a method for producing the semiconductor via 4 is explained with reference to FIGS. 9A to 9C below.

Figure 9A:
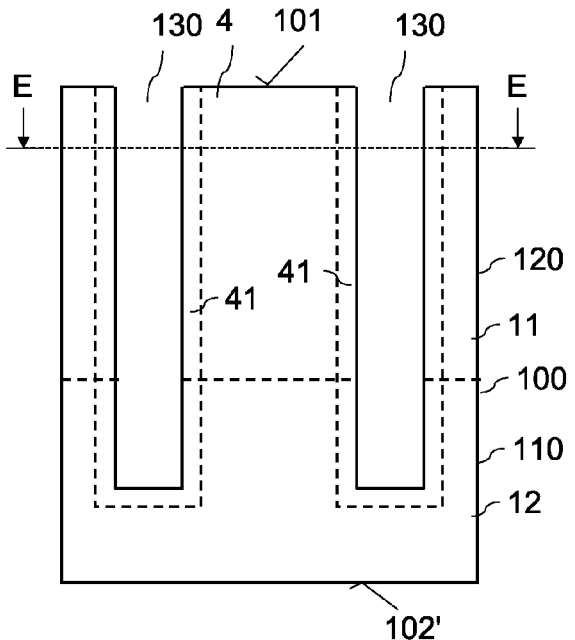
FIGS. 9A to 9C illustrates an embodiment of a method for producing a semiconductor via and a via insulation layer surrounding the semiconductor via.
Figure 10A:
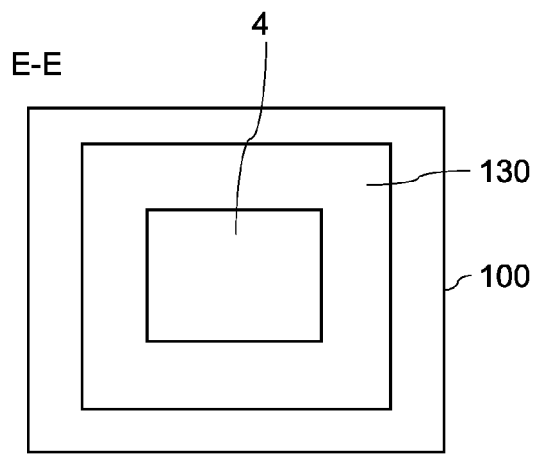
Figure 10B:
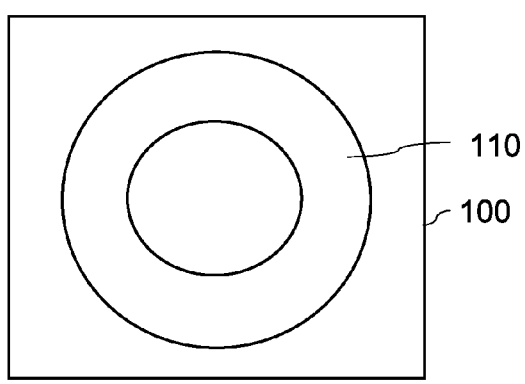

Referring to FIG. 9A a ring-shaped trench 130 is formed to extend from the first surface 101 into the semiconductor body 100. This trench 130 does not completely extend through the semiconductor body 100, so that a second surface 102' of the semiconductor body 100 at this stage of the manufacturing process does not yet correspond to the final second surface 102 of the semiconductor body of the transistor device. Referring to FIGS. 10A and 10B, which each show a horizontal cross sectional view of the semiconductor body 100 of FIG. 9A, one ring-shaped trench 130 is formed that may have a conventional geometry, such as a rectangular geometry (see FIG. 10A) and elliptical or circular geometry (see FIG. 10B), a hexagonal geometry or any other polygonal geometry (not shown). In these cases the semiconductor via 4 basically has a pile-shaped geometry.

Figure 11:
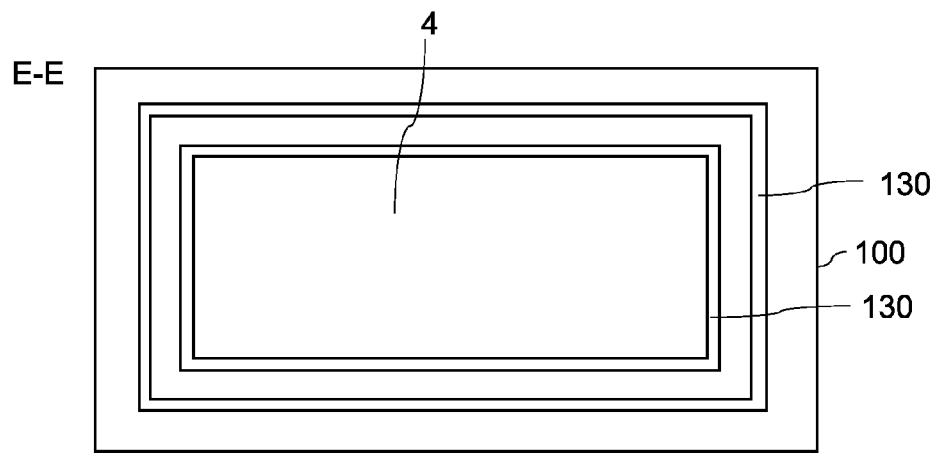
FIG. 11 illustrates a horizontal cross sectional view of the semiconductor via according to a further embodiment.

Referring to further embodiments illustrated in FIG. 11, two ring-shaped trenches 130 are formed, where the semiconductor via 4 is the semiconductor region between these two trenches and also has a ring-shaped geometry.

Again referring to FIG. 9A, dopant atoms can be implanted and/or diffused via the at least one ring-shaped trench 130 into the semiconductor body 100, in particular into sidewalls of the at least one trench 130 that adjoins the semiconductor via 4. These dopant atoms are of the same conductivity type as the dopant atoms that form the semiconductor via 4 prior to the diffusion and/or implantation process. In FIG. 9A reference character 41 denotes doped regions 41 along the sidewalls of the at least one trench 130 formed by the optional diffusion and/or implantation process. These higher doped regions 41 along the sidewalls of the at least one trench 130 help to reduce an electrical resistance of the semiconductor via 4.

Figure 9B:
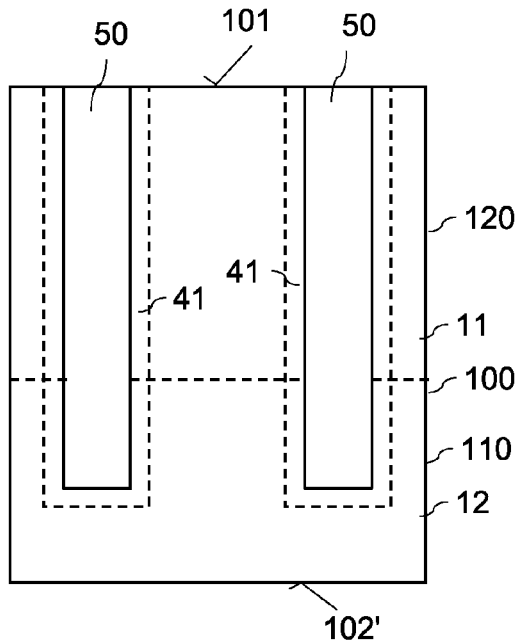

Referring to FIG. 9B, the at least one trench 130 is filled with an electrically insulating material 50, such as an oxide or a nitride. An oxide can be formed by employing a thermal oxidation process and/or by a deposition process.

Figure 9C:
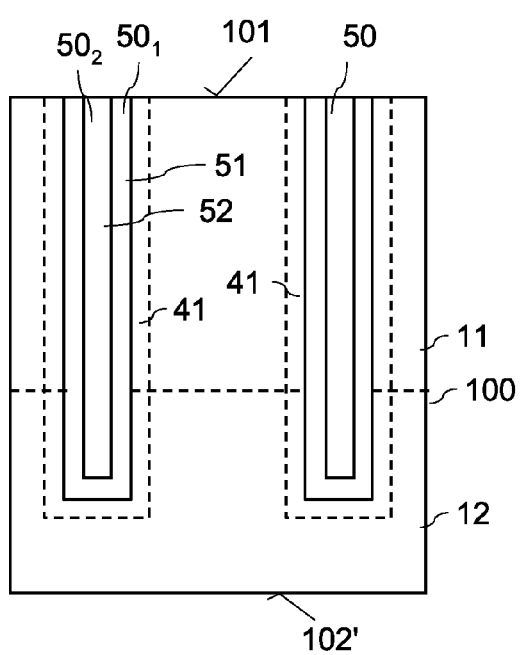

Referring to FIG. 9C, the electrical insulating layer 50 filling the at least one trench 130 may include several sub-layers, such as a first sub-layer $50_1$ on the sidewalls and the bottom of the trench 130 and a second sub-layer $50_2$ arranged on the first sub-layer $50_1$ and completely filling the trench 130. The first sub-layer $50_1$ may be a thermally grown oxide, while the second sub-layer $50_2$ may be a deposited oxide or a nitride. At least sections of the electrically insulating layer 50 in the at least one trench 130 form the via insulation layer 5 of the final transistor device.

A first embodiment of a method for producing the gate electrode 21 is explained with reference to FIGS. 12A to 12I below. FIGS. 12A to 12C and 12E to 12I illustrate vertical cross sectional views of the semiconductor body 100, while FIG. 12D illustrates a horizontal cross sectional view. In the vertical cross sectional view only those sections of the semiconductor body 100 below the first surface 101 are shown in which the gate electrode 21 is produced. The second surface 102 of the semiconductor body 100 is not illustrated in these Figures.

Figure 12A:
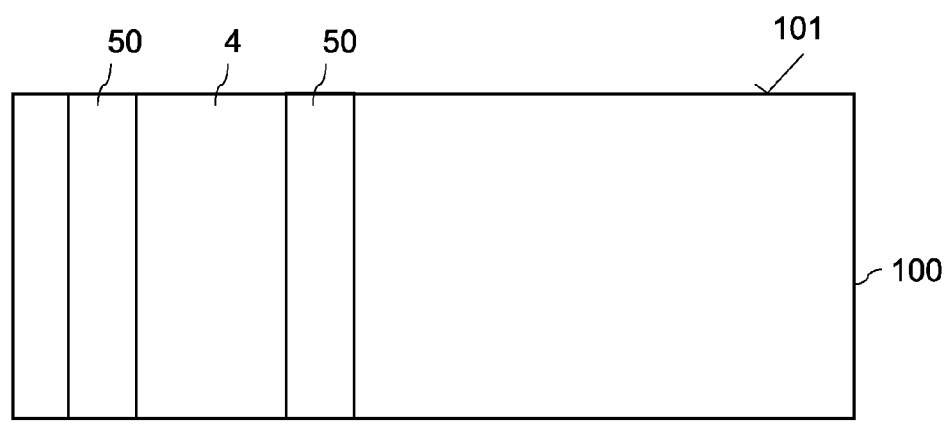
FIGS. 12A to 12I illustrates a second embodiment of a method for producing a vertical transistor device.

FIG. 12A illustrates a vertical cross sectional view of the semiconductor body 100 after producing the semiconductor via 4 and the insulation layer 50 surrounding the semiconductor via 4. Referring to FIG. 12C at least one longitudinal trench 140 is formed in the transistor cell region 103 and the connection region 104 of the semiconductor body 100. The at least one trench 140 in the first lateral direction extends through the insulation layer 50 into the semiconductor via 4. The geometry of this trench 140 defines the geometry of the gate electrode 21. Referring to the explanation provided with reference to FIGS. 3 to 4, one trench 140, a plurality of parallel trenches 140 or a trench 140 with a grid-shaped geometry may be formed.

Forming the at least one trench 140 may include an etching process employing an etch mask 210 which defines the size and the geometry of the at least one trench 140. The etch mask 210 which is also illustrated in FIG. 12C is, for example, an oxide hard mask.

Figure 12B:
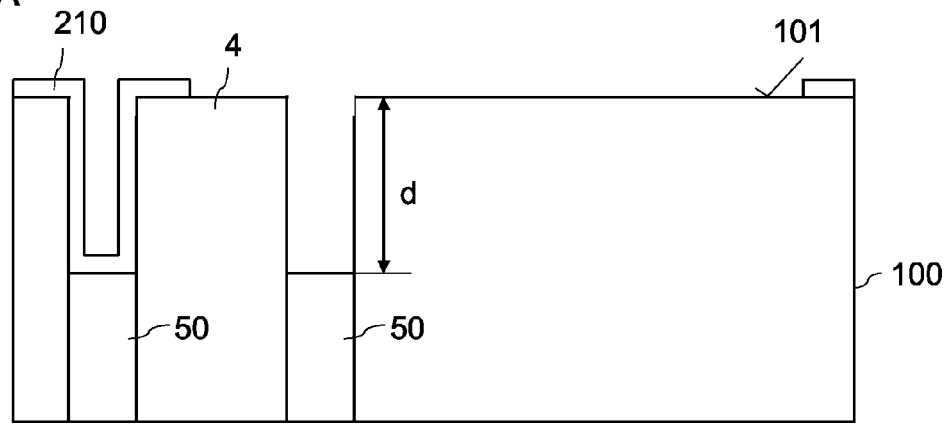
Figure 12C:
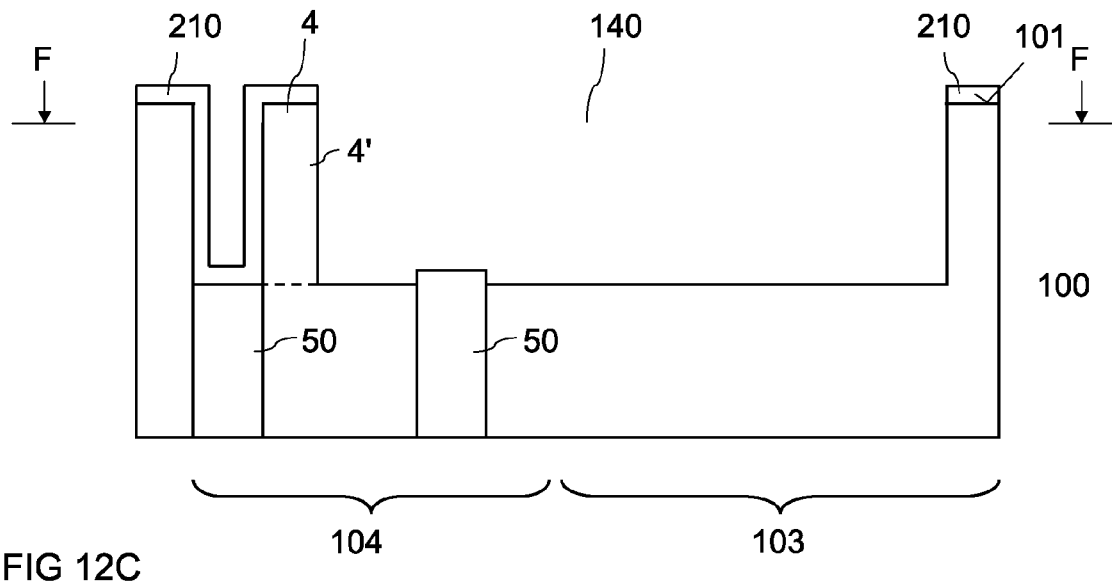
Figure 12D:
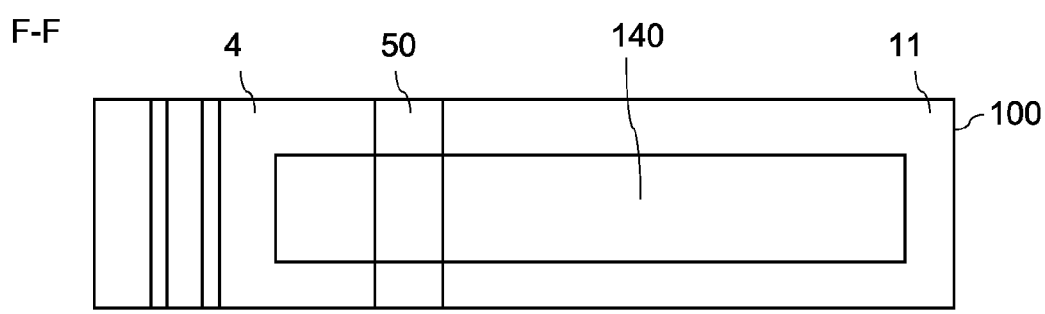

Referring to FIG. 12B, forming the at least one trench 140, prior to forming the etch mask 210, may include removing the insulation layer 50 from upper regions of the at least one ring-shaped trench (130 in FIG. 9A), which means from those regions adjoining the first surface 101. A depth d of a region in which the insulation layer 50 is removed, may correspond to a desired depth of the at least one trench 140. Removing the insulation layer 50 may include an etching process that etches the material of the insulation layer 50 selectively relative to the material of the semiconductor body 100. After removing the insulation layer 50 from upper regions of the ring-shaped trench, the etch mask 210 is produced, where the etch mask 210 covers the surface 101 of the semiconductor body 100 in those regions which should not be etched when producing the at least one trench 140. Referring to FIG. 12C the etch mask 210 at least covers the sidewalls of those regions of the ring-shaped trench which should not be etched when producing the at least one trench 140. Referring to FIG. 12C, the at least one trench 140 is formed such that it extends into the semiconductor via 4 in the first lateral direction, but does not completely extend through the semiconductor via 4, so that a section 4' of the semiconductor via 4 remains between the trench 140 and those sections of the ring-shaped trench that remain after the process of producing the at least one trench 140.

According to a further embodiment (illustrated in dashed lines in FIG. 12C), the at least one trench 140 in the lateral direction extends through the insulation layer 50 on one side of the semiconductor via 4, through the semiconductor via 4 and to or into the insulation layer 50 or the etch mask 210 on the other side of the semiconductor via. While in the embodiment illustrated in solid lines in FIG. 12C the semiconductor via 4 adjoins the trench at a bottom and at a longitudinal end (the section 4' adjoins the longitudinal end of the trench 140), in the embodiment illustrated in dashed lines the semiconductor via 4 only adjoins the bottom of the trench 140.

FIG. 12D illustrates a horizontal cross sectional view of the semiconductor body 100 in a section plane F-F illustrated in FIG. 12C. FIGS. 12A to 12I illustrate a method for producing a gate electrode 21 which is electrically connected to a semiconductor via 4 at one lateral end. However, this method can easily be adapted to a method for producing a gate electrode 21 that is electrically connected to a semiconductor via at both lateral ends.

Figure 12E:
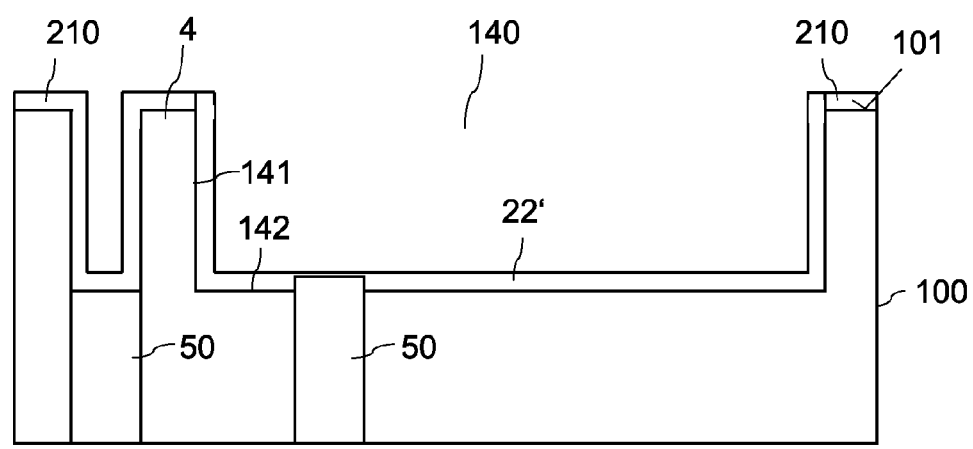

Referring to FIG. 12E a dielectric layer 22' is produced on the bottom and the sidewalls of the at least one trench 140. Sections of the dielectric layer 22' form the gate dielectric 22 of the transistor device. The dielectric layer 22' is, for example, a thermally grown oxide layer.

Figure 12F:
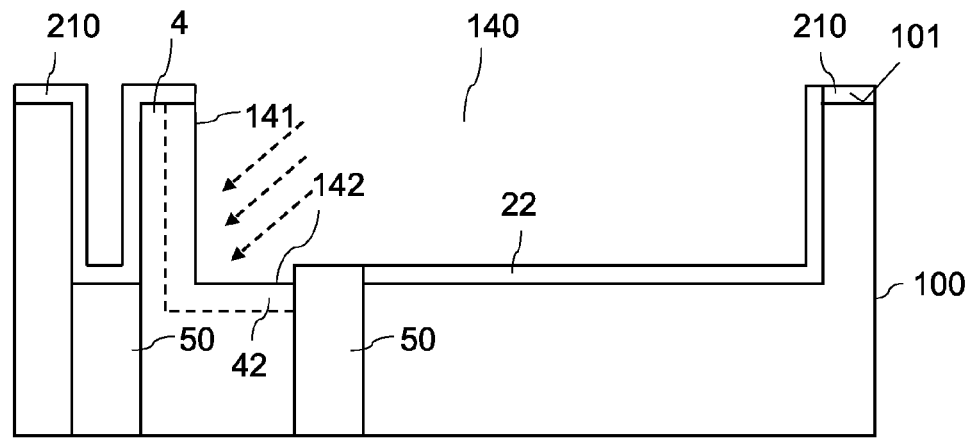

Referring to FIG. 12F, at least sections of the dielectric layer 22' covering the semiconductor via 4 are removed. Referring to FIG. 12E, the at least one trench 140 has sidewall sections 141 and a bottom section 142 that adjoin the semiconductor via 4. In the embodiment illustrated in FIGS. 12E and 12F, the dielectric layer 22 is completely removed from these sidewall sections 141 and bottom section 142. However, this is only an example. It is also possible to remove the dielectric layer 22' only from one of the sidewall sections 141 and the bottom section 142.

Referring to FIG. 12F, dopant atoms are optionally implanted and/or diffused into those regions of the semiconductor via 4 that are uncovered after the removal process that at least partially removes the dielectric layer 22'. The dopant atoms form a higher doped via region 42, where this higher doped region helps to reduce the electrical resistance between the gate electrode 21 produced in next method steps and the semiconductor via 4.

Figure 12G:
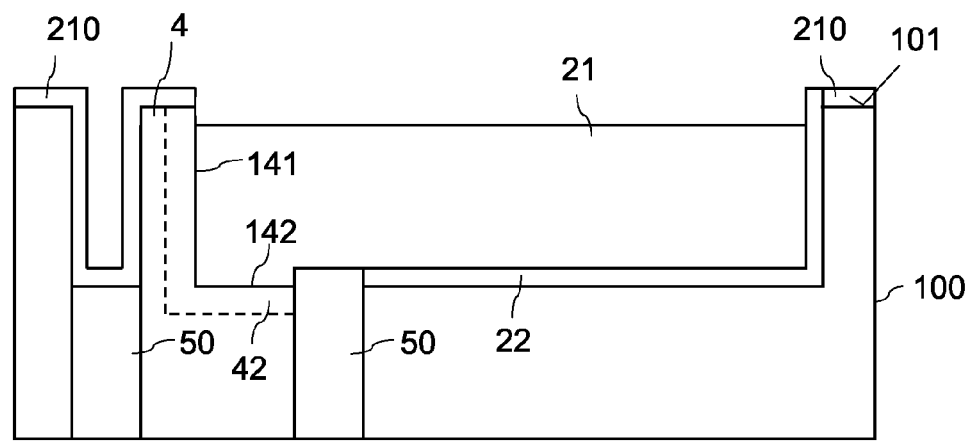
Figure 12H:
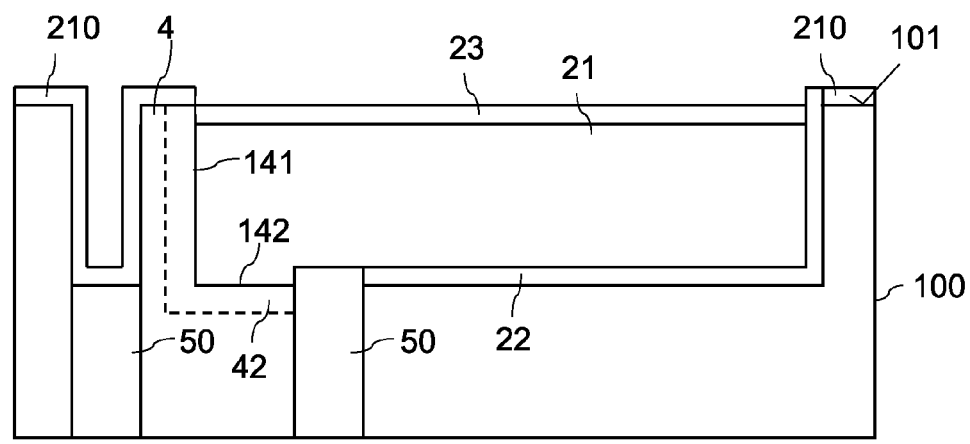

Referring to FIG. 12G, the gate electrode 21 is formed in the at least one trench 140. Forming the gate electrode 21 may include completely filling the trench 140 with a gate electrode material and etching back the gate electrode material to below the first surface 101. Referring to FIG. 12H, the insulation layer 23 is then produced on top of the gate electrode 21. Forming the insulation layer 23 may include a thermal oxidation process and/or a deposition process. The gate electrode 21 includes, for example, a metal and/or a polycrystalline semiconductor material, such as polysilicon.

Figure 12I:
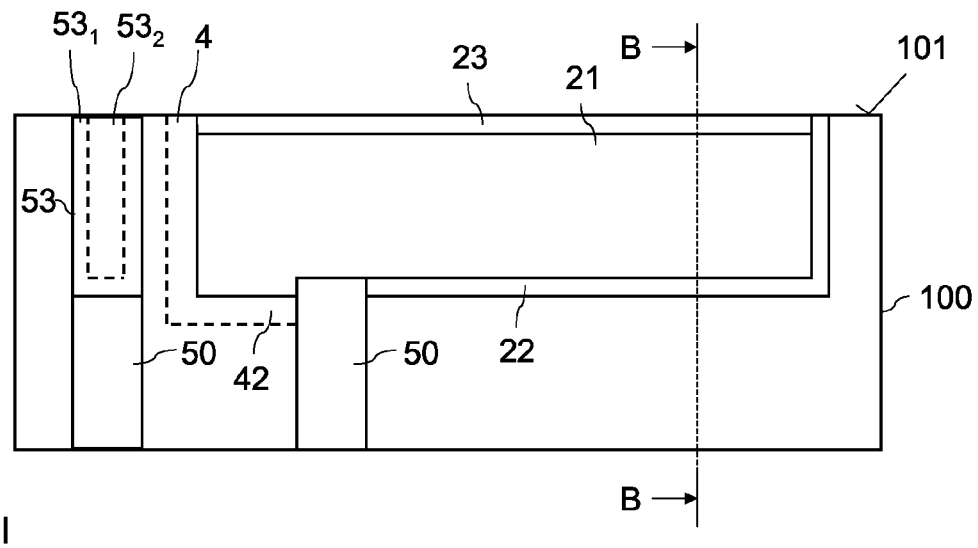

The etch mask 210 may remain on the first surface 101 of the semiconductor body 100 during the process steps after forming the at least one trench 140. Referring to FIG. 12I the etch mask 210 is then removed from the first surface 101. Removing the etch mask 210 may, for example, include a polishing process, such as a mechanical polishing process, a chemical polishing process or a chemical-mechanical polishing process. The etch mask 210 may remain in those sections of the ring-shaped trench that have not been etched in the process of producing the at least one trench 140 and may form a section 53 of the via insulation layer 5. When the etch mask 210 is produced such that it only covers the sidewalls of the ring-shaped trench, a remaining trench is completely filled with an insulating material. In FIG. 12I, reference character $53_1$ denotes sections of the etch mask 210 remaining in the ring-shaped trench, and reference character $53_2$ denotes a filling material that completely fills the trench. Referring to FIG. 12I, the via insulation layer 5 includes sections of the insulation layer 50, as well as sections $53_1$ of the etch mask 210 and the filling material $53_2$. According to a further embodiment, the etch mask 210 completely fills the ring-shaped trench in those sections in which the gate electrode 21 does not extend through the trench. In this case, an additional filling process is not required.

Figure 13A:
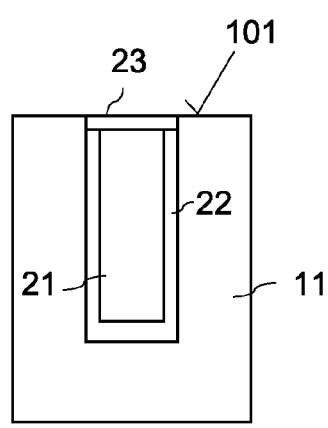
FIGS. 13A and 13B illustrates further method steps of the method according to FIGS. 12A to 12I.
Figure 13B:
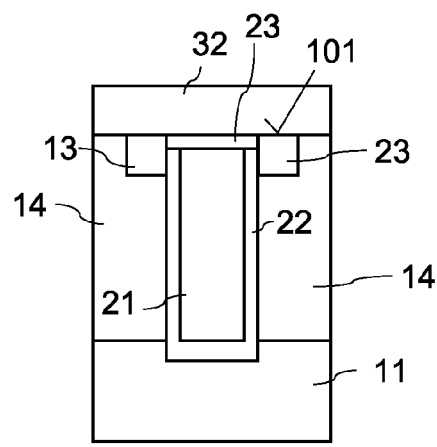

After forming the gate electrode 21 and before forming the source electrode 32 the source and body regions 13, 14 are produced. This is illustrated in FIGS. 13A and 13B, which each show a vertical cross sectional view in a section plane B-B through the gate electrode 21. FIG. 13A shows a vertical cross sectional view after the process steps illustrated in FIG. 12I. FIG. 13B shows the vertical cross sectional view after producing the source and body regions 13, 14 as well as the source electrode 32. Producing the source and body regions may, for example, include implantation and/or diffusion processes in which dopant atoms are introduced into the semiconductor body. After forming the source and body regions 13, 14 the source electrode 32 is formed on the first surface 101. The source electrode 32 is, for example, produced by depositing an electrode material, such as a metal or a polycrystalline semiconductor material.

FIGS. 14A to 14J illustrate a method for producing a trench transistor device that includes a gate electrode 21 and a field electrode 61 arranged in the same trench.

Figure 14A:
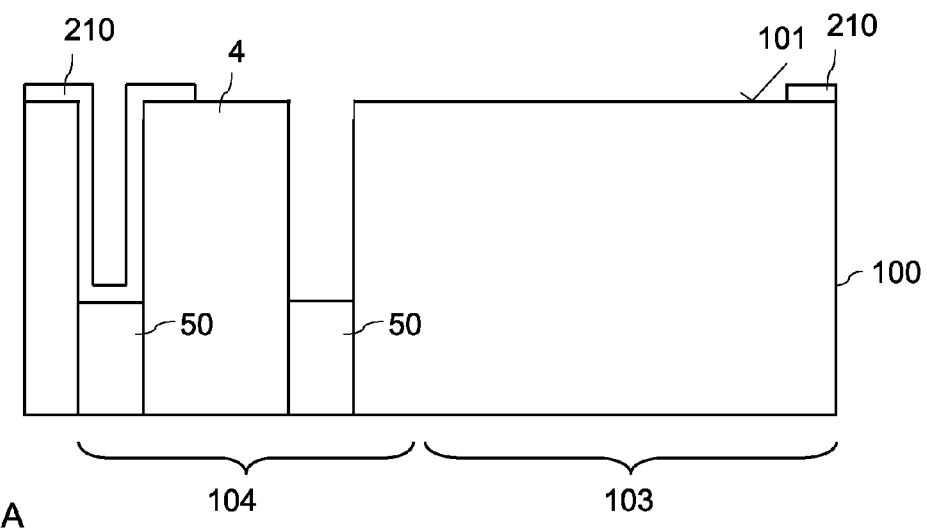
FIGS. 14A to 14J illustrates a method for producing a vertical transistor device.

Like in the method illustrated in FIGS. 12A to 12C, at least one first trench 140 is formed to extend from the first surface 101 into the semiconductor body 100. Forming the at least one trench 140 includes employing an etch mask 210 that covers those regions of the semiconductor body 100 that are not to be etched. FIG. 14A illustrates a vertical cross sectional view of the semiconductor body 100 after forming the etch mask 210 and before etching the trench.

Figure 14B:
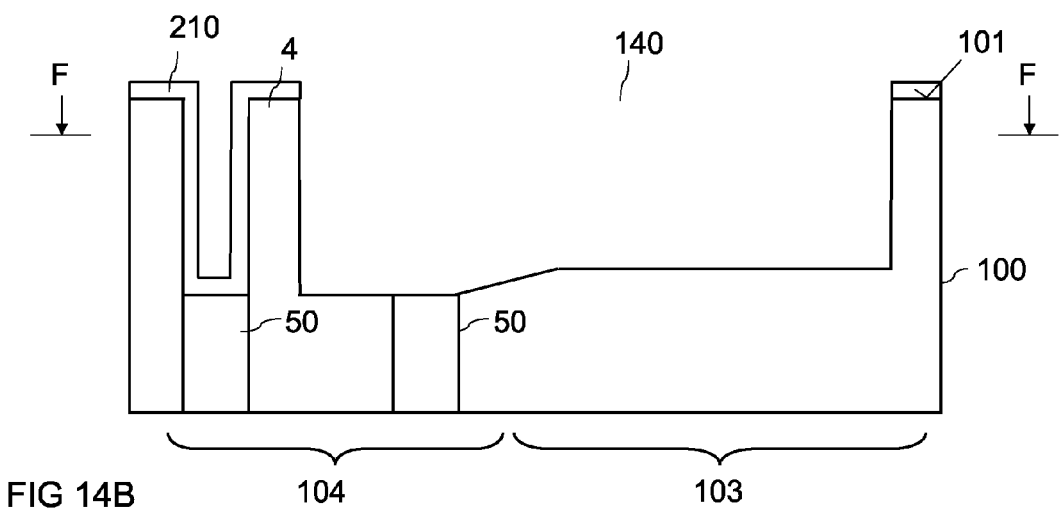
Figure 14C:
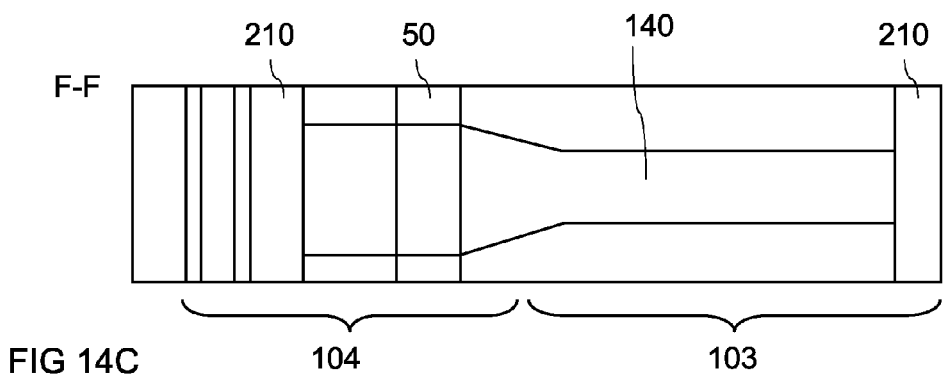

FIG. 14B shows a vertical cross sectional view of the semiconductor body 100 after forming the at least one trench 140, and FIG. 14C shows a horizontal cross sectional view in a section plane F-F after forming the at least one trench 140. Referring to FIG. 14C, the at least one trench 140 is formed such that it is wider in the gate connection region 104 than in the transistor cell region 103. This can be obtained by suitably defining the geometry of the etch mask 210. Forming the at least one trench 140 to be wider in the gate connection region 104 than in the transistor cell region 103 may also involve that the at least one trench 140 is deeper in the gate connection region 104 than in the transistor cell region 103. However, this is not required in order to obtain the desired transistor device.

Figure 14D:
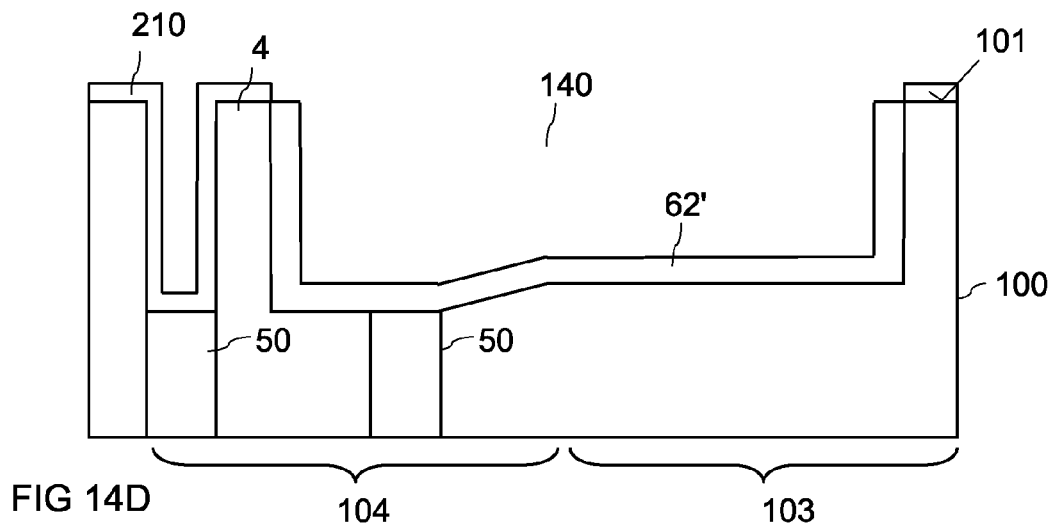

Referring to FIG. 14D, a first dielectric layer 62' is formed on the bottom and the sidewalls of the at least one trench 140. Sections of the first dielectric layer 62' form the field electrode dielectric 62 that dielectrically insulates the field electrode (61 in FIG. 7B) from the surrounding semiconductor regions of the semiconductor body 100.

Figure 14E:
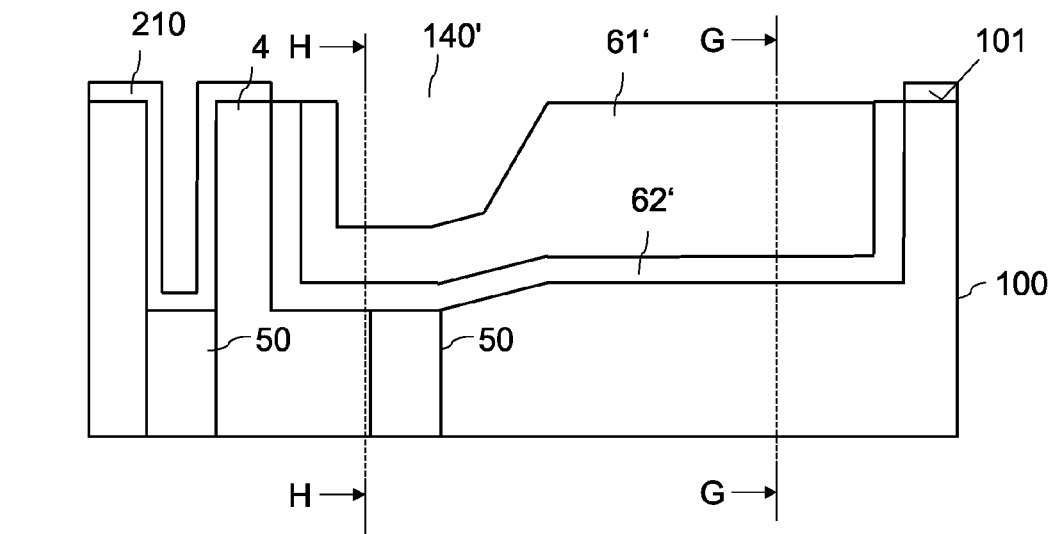
Figure 14F:
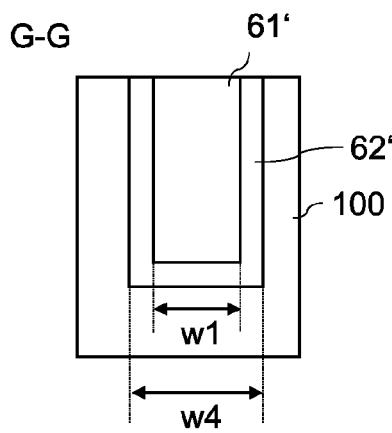
Figure 14G:
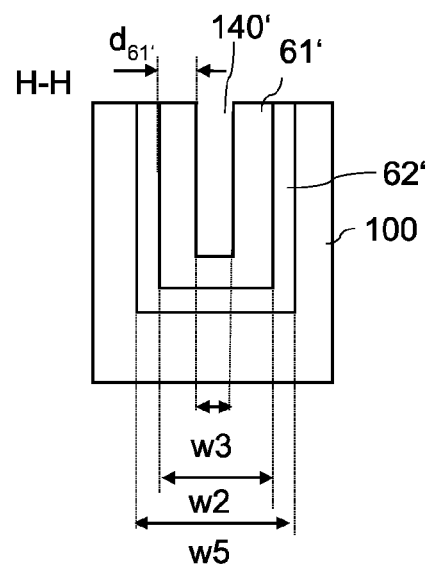

Referring to FIG. 14E, a first electrode layer 61' is deposited on the first dielectric layer 62' in the at least one trench 140. A layer thickness of the first electrode layer 61' is selected such that the first electrode layer 61' completely fills the at least one trench 140 in the transistor cell region 103, where the trench is narrower, and only covers the bottom and the sidewalls of the at least one trench 140 in the gate connection region 104, where the trench is wider, so as to leave a residual trench 140' in the gate connection region 104. This is illustrated in FIGS. 14F and 14G which show horizontal cross sectional views in sections planes G-G and H-H that extend through the trench with the first dielectric layer 62' and the first electrode layer 61' in the transistor cell region 103 and the gate connection region 104. Assume, that w1 is the width of the trench 140 in the transistor cell region 103 after forming the first dielectric layer 62', and that w2 is the (maximum) trench width of the trench 140 in the wider trench section. In this case, a thickness $d_{61'}$ of the deposited first electrode layer 61' is more than 50% of trench width w1 in order to completely fill the trench 140 in the transistor cell region 103, but less than 50% of a trench width w2 of the wider trench section in the gate connection region 104 in order to leave the residual trench. That is:

$$2d_{61'} \geq w1 \quad (1a)$$

$$2d_{61'} < w2 \quad (1b)$$

A width w3 of the residual trench 140' is given as:

$$w3 = w2 - 2d_{61'} \quad (1c)$$

According to one embodiment, the thickness d of the electrode layer 61' is selected such that a width w3 of the residual trench is at least 200 nm, or at least 500 nm (nanometers). The thickness d of the electrode layer 61' may be selected relative to the width w1 such that the width w1 is smaller than twice the thickness (2d>w1), and in particular such that $$w1 < 2d_{61'} - x \quad (1d),$$

wherein x is the difference between twice the thickness $d_{61'}$ and the trench width w1. According to one embodiment, the trench width w1 and the thickness $d_{61'}$ are selected such that x is at least 100 nm.

According to one embodiment, the width w1 is selected to be between 700 nm and 800 nm, and the thickness d is selected to be about 450 nm in order to meet relationship (1a) (2×450 nm<700 . . . 800 nm). In this case, x is between 200 nm and 100 nm. In this embodiment, the width w2 of the wider trench region may be selected to be at least 1400 nm, so that the width w3 of the residual trench is about 500 nm.

Figure 14H:
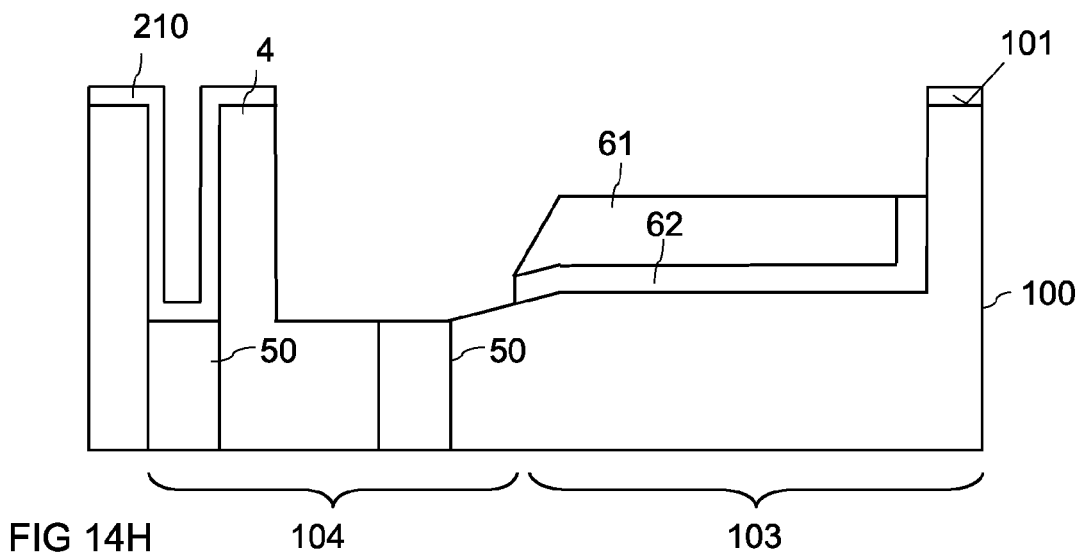

Referring to FIG. 14H, the first electrode layer 61' is then etched back using, for example, an isotropic etching process. However, an anisotropic etching process may be used as well. In this etching process the first electrode layer 61' is completely removed in the gate connection region 104, while in the transistor cell region 103, the first electrode layer 61' is only etched back down to below the first surface 101, so as to form the field electrode 61. In the following oxide etch process, the first dielectric layer 62' is removed in those sections that are uncovered after etching back the first electrode layer 61'. Removing the first dielectric layer 62' from these uncovered regions may, for example, include an isotropic or an anisotropic etching process.

Figure 14I:
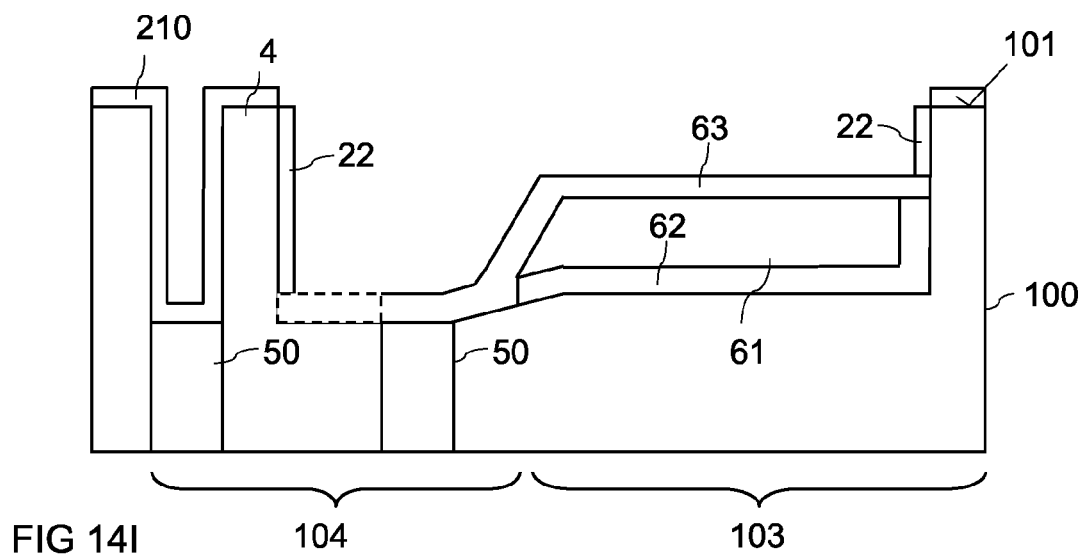

Referring to FIG. 14I, the inter-electrode dielectric 63 is formed on the field electrode 61. Forming the inter-electrode dielectric 63 may, for example, include a deposition process, such as a High Density Plasma (HDP) process. In this deposition process, the inter-electrode dielectric 63 is basically only deposited on horizontal surfaces, such as on the bottom of the trench and on the field electrode 61, but not on vertical surfaces, such as sidewalls of the trench 140. According to a further embodiment, a thermal oxidation process may be used that forms the inter-electrode dielectric 63 as well as oxide layers on the sidewalls. In the embodiment illustrated in FIG. 14I, the inter-electrode dielectric 63 is not only deposited on the field electrode 61 but also on those sections of the bottom of the at least one trench that are uncovered after removing the first dielectric layer 62'.

Further, the gate dielectric 22 is formed on sidewalls of the at least one trench 140 that remain after producing the field electrodes 61. Similar to the process steps explained with reference to FIGS. 12E and 12F, the gate dielectric 62 is removed from the sidewall 141 that adjoins the semiconductor via 4. The inter-electrode dielectric 63 may remain on the bottom region adjoining the semiconductor via 4 (as illustrated in dashed lines), but could also be removed by employing a suitable etching process. Optionally, dopant atoms can be implanted into the semiconductor via 4 in order to produce the higher doped region 42 shown in FIG. 14J.

Figure 14J:
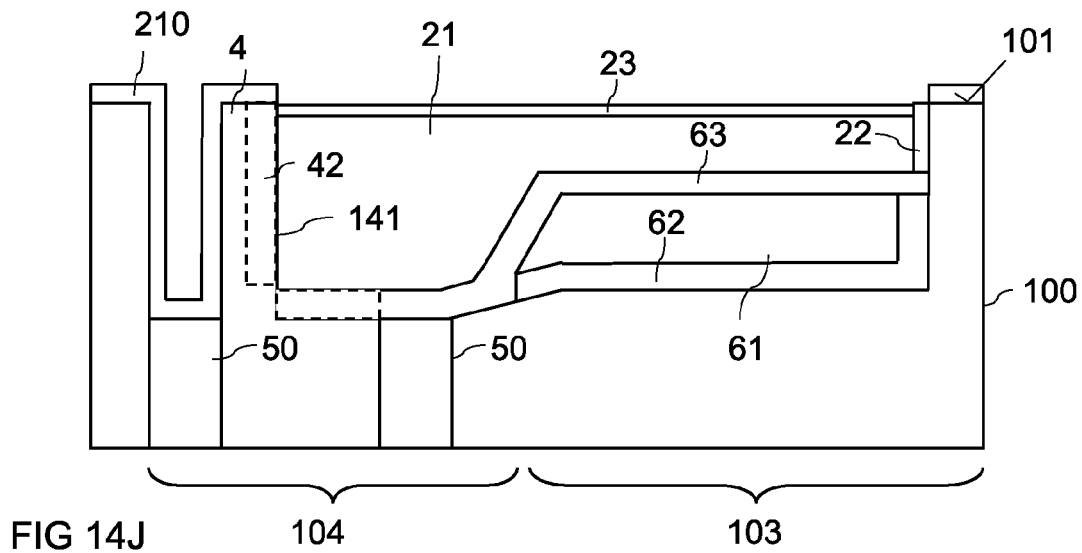

Referring to FIG. 14J, the gate electrode 21 and the insulation layer 23 on top of the gate electrode 21 are formed. The process steps for forming the gate electrode 21 and the insulation layer 23 may correspond to the process steps explained with reference to FIGS. 12G and 12H.

Forming the gate electrode 21 may include a deposition process in which an gate electrode material is deposited in the trench that remains after the field electrode 61 and the inter-electrode dielectric 63 has been formed. In the cell region 103 this trench, above the inter electrode dielectric 63, has a width corresponding to the width of the trench 140 in the cell region 103 minus twice a thickness of the gate dielectric. Referring to FIG. 14F, the width of the trench 140 in the cell region 103 is w4, while the wider width in the contact region is w5. A thickness of the deposited gate electrode material may be selected such that the gate electrode material completely fills the trench in the contact region 104. That is, $$w5 \leq 2d_{21} \quad (2a)$$

wherein $d_{21}$ denotes a thickness of the deposited gate electrode material forming the gate electrode 21. Referring to (2a), a thickness of this layer is more than half of the trench width. According to one embodiment, $$d_{21} = w5/2 + x2 \quad (2b),$$

where x2 may be at least 200 nm.

Figure 15:
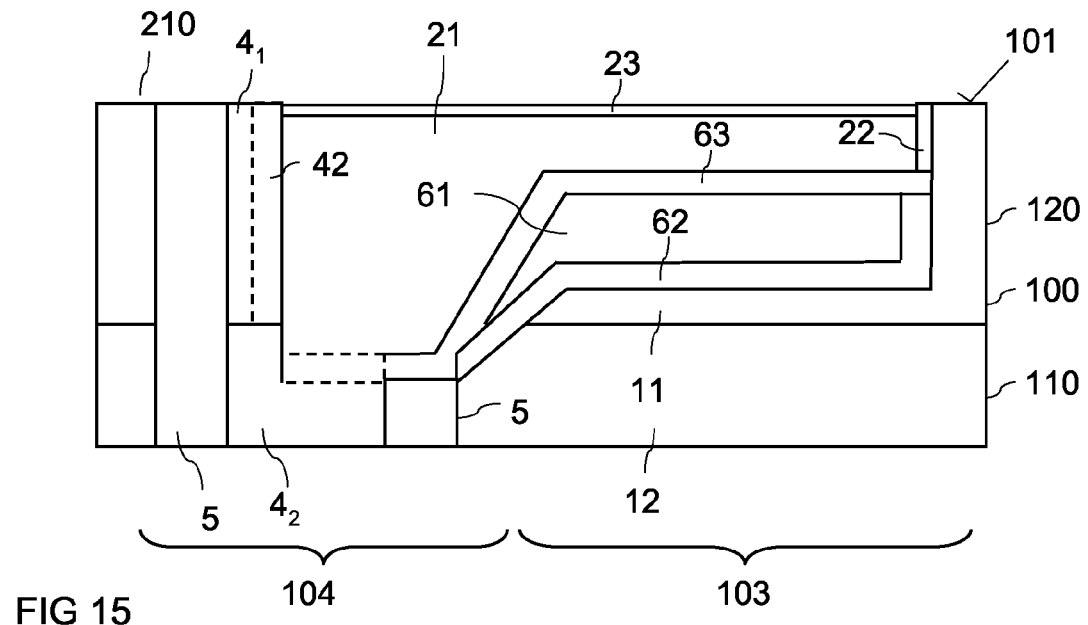
FIG. 15 illustrates a vertical cross sectional view of a transistor according to a further embodiment.

Referring to FIG. 15, which shows a vertical cross sectional view of a transistor component, the semiconductor body 100 may include a higher doped layer 110 and a lower doped layer 120, and the trench for implementing the field electrode 61 and the gate electrode 21 can be produced such that it extends into the higher doped layer 110 in the gate connection region 104, while it does not extend to the higher doped layer 120, that forms the drain region 12, in the transistor cell region 103. In this case, the gate electrode 21 is electrically connected to the gate connection electrode (not shown in FIG. 15) through the higher doped via region $4_2$.

Instead of providing the semiconductor body 100 with a higher doped layer and a lower doped layer, it is also possible to provide the semiconductor body 100 with a basic doping concentration that corresponds to the desired doping concentration of the drift region 11 and to form the drain region 12 by implanting and or diffusing dopant atoms via the second surface 102 into the semiconductor body 100.

Although embodiments of the present invention have been disclosed with reference to a transistor device that has a trench gate electrode connected to the semiconductor via, the invention is not restricted to be used in connection with a transistor device. Instead, a trench electrode arranged in the region of a first surface of a semiconductor body and connected to a semiconductor via extending through the semiconductor body may be employed in a plurality of other semiconductor devices as well.

Figure 16:
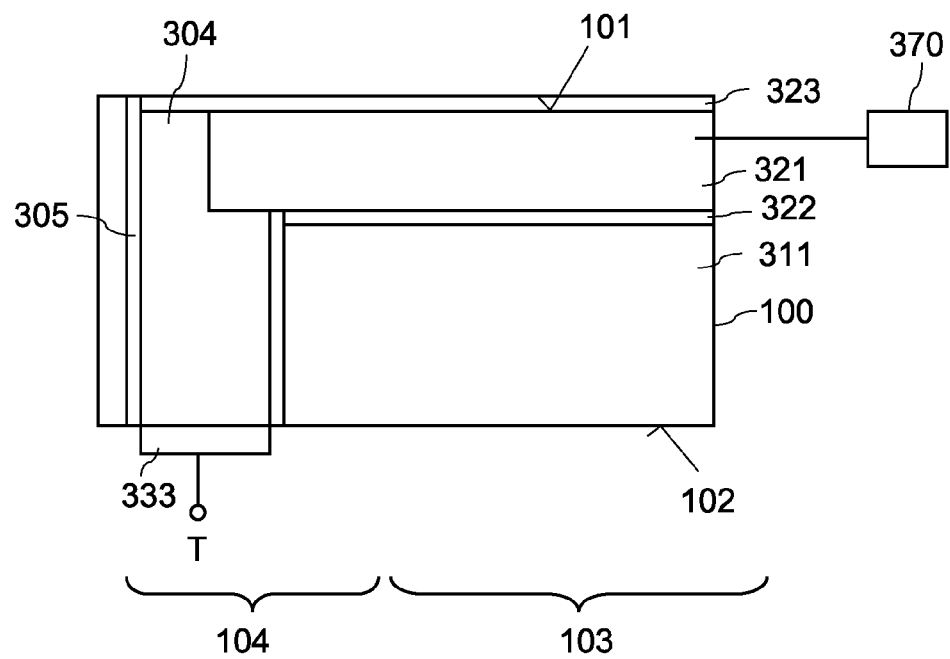
FIG. 16 illustrates a vertical cross sectional view of a semiconductor device including a trench electrode and a semiconductor via.

FIG. 16 illustrates a vertical cross sectional view of a semiconductor device including a semiconductor body 100 with a first surface 101 and a second surface 102 and with a semiconductor via 304 that extends in the semiconductor body 100 in a vertical direction to the second surface 102 where a contact electrode 333 is electrically connected to the semiconductor via 304. The semiconductor via 304 is electrically insulated from the semiconductor body 100 by an insulation layer 305. That which has been explained concerning the semiconductor via 4, the insulation layer 5, and the gate electrode 33 herein before applies to the semiconductor via 304, the insulation layer 305, and the contact electrode 333, respectively, accordingly. A trench electrode 321 arranged in a trench in the region of the first surface 101 of the semiconductor body 100 extends into the semiconductor via 304 and is electrically connected to the semiconductor via 304. The trench electrode is insulated from the semiconductor body 100 by an insulation layer 322. A further insulation layer 323 may be arranged on top of the trench electrode 323.

Referring to FIG. 16, the trench electrode 321 is electrically connected to a sensor 370 or other type of integrated circuitry integrated in the semiconductor body 100. This sensor or circuitry 370 is only schematically illustrated in FIG. 16. The sensor, is, for example a temperature sensor, an acceleration sensor, a current sensor, or the like. The trench electrode 321 is electrically connected to one terminal of the sensor 370, so as to electrically connect this terminal to the contact electrode 333. Several trench electrodes 321, several semiconductor vias 304 and several contact electrodes 333 that are electrically insulated from one another can be implemented in one semiconductor body in order to electrically contact several sensors or to contact two or more terminals of one sensor via the second surface. Further a trench transistor as explained with reference to FIGS. 1 to 15 before and a sensor or other circuitry may be implemented in one semiconductor body wherein the gate electrode of the transistor may be connected to a first semiconductor via, while the sensor may be connected to at least one second sensor.

Figure 17:
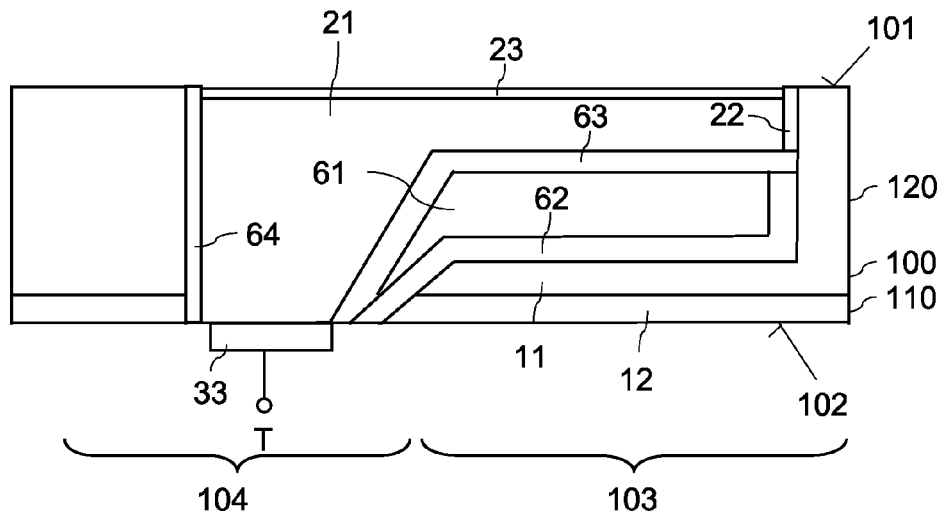
FIG. 17 illustrates a vertical cross sectional of a semiconductor device according to a further embodiment.

FIG. 17 illustrates a vertical cross sectional view of a semiconductor device according to a further embodiment. The semiconductor device of FIG. 17 is modification of the devices illustrated in FIGS. 14J and 15 and is different from these embodiments in that the gate electrode 21 in the contact region 104 extends down to the second surface 102 where it may be connected to the gate connection electrode 33. Thus, no additional via, such as via 4 shown in FIGS. 14J and 15, is needed to connect the gate electrode 21 to the gate connection electrode 33 on the second surface 102.

A method for producing the semiconductor device shown in FIG. 17 may correspond to the method explained with reference to FIGS. 14A to 14J with the difference that producing the semiconductor via 4 and the via insulation layer 5 laterally surrounding the via 4 can be omitted. FIGS. 18A to 18I illustrate one embodiment of a process sequence for producing the semiconductor device of FIG. 16. FIGS. 18A to 18I show cross sectional views of the semiconductor body during (after) individual process steps. These sectional views shown in FIGS. 18A to 18I correspond to the sectional views shown in FIGS. 14B to 14J, with the difference that the device shown in FIGS. 18A to 18I does not include the via 4 and the via insulation layer 5. Thus, the explanation to FIGS. 14B to 14J, to which reference is made, applies to the process illustrated in FIGS. 18A to 18I equivalently. These process steps are briefly summarized, for details reference is made to FIGS. 14B to 14J and the corresponding description.

Figure 18A:
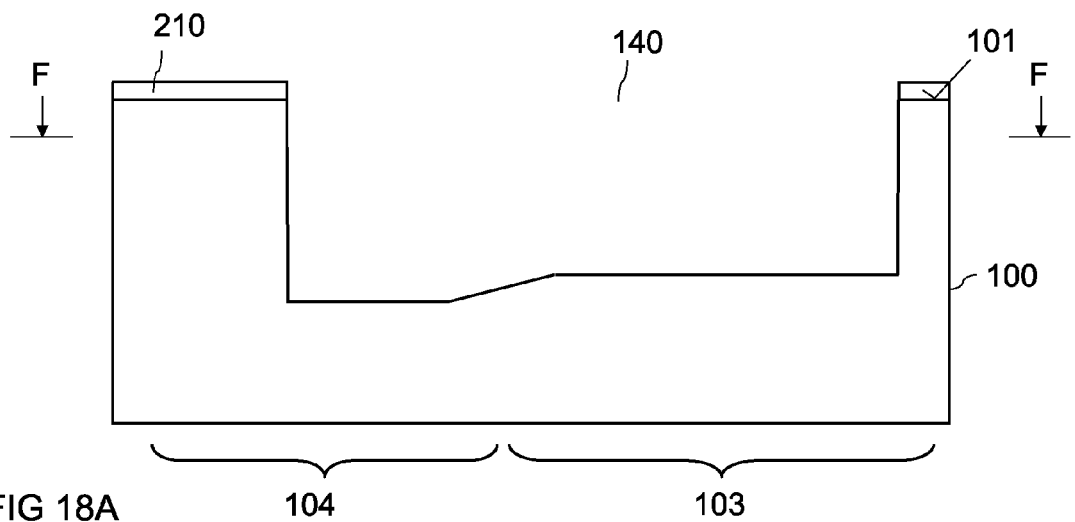
FIGS. 18A to 18J illustrates one embodiment of a method for producing the semiconductor device shown in FIG. 17.
Figure 18B:
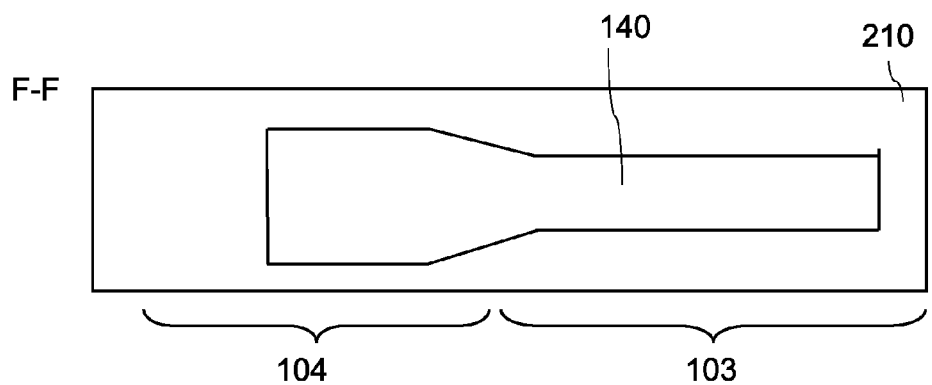
Figure 18C:
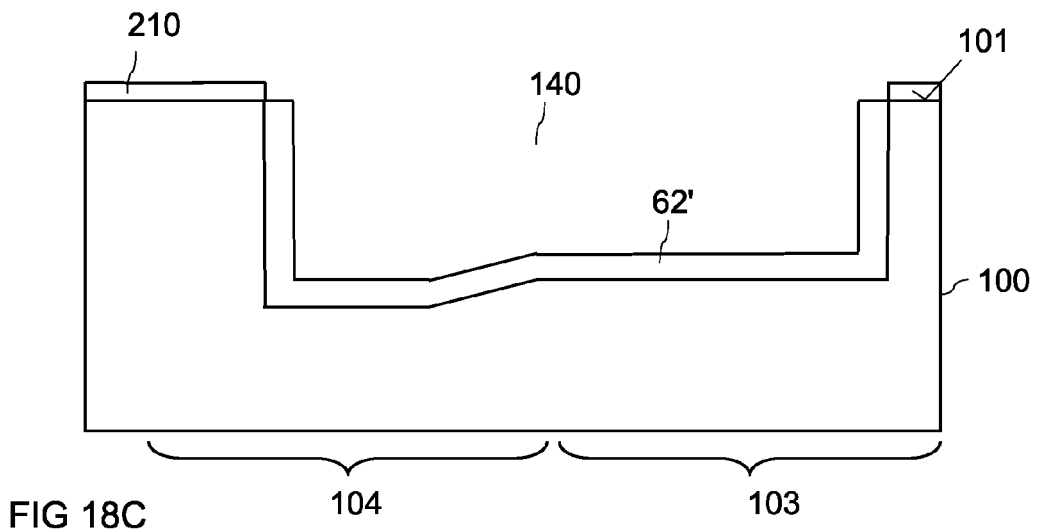
Figure 18D:
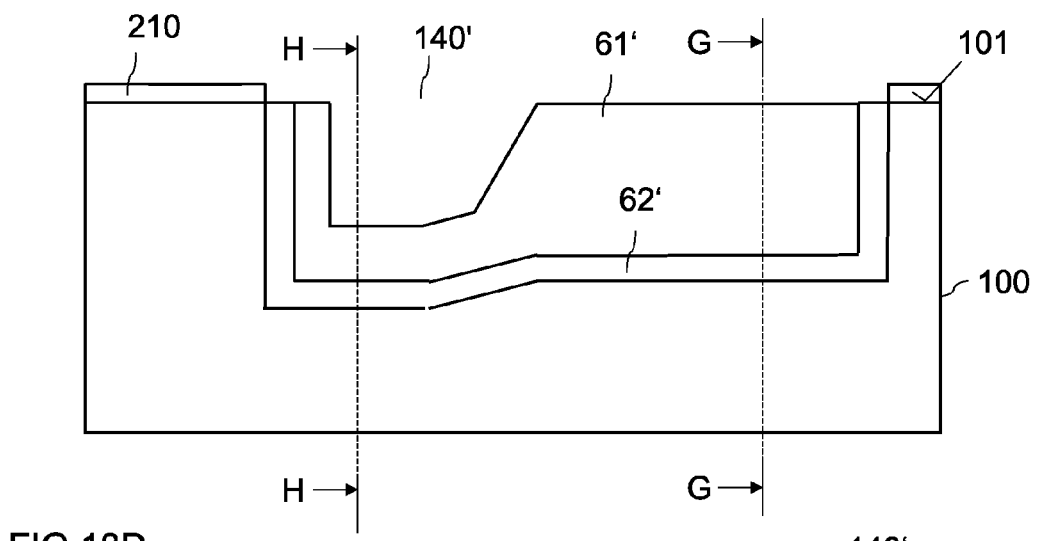
Figure 18E:
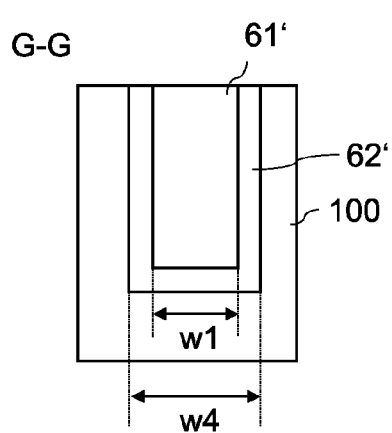
Figure 18F:
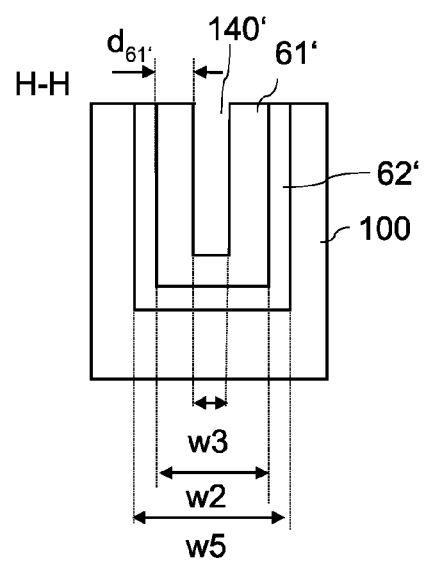

Referring to FIGS. 18A and 18B, the trench with the narrower trench section in the cell region 103 and the wider trench section in the contact region 104 is formed, e.g. by an etching process using the mask 210. Referring to FIGS. 18C and 18D, the bottom and the sidewalls of the trench 140 are covered with the first dielectric layer 62', and the first electrode layer 61' is formed on the first dielectric layer 62'. Referring to FIGS. 18E and 18F, the first electrode layer is formed with a thickness d such that the narrower trench section that has the width w2 after forming the first dielectric layer 62' is completely filled, while a residual trench 140' remains in the wider trench section.

Figure 18G:
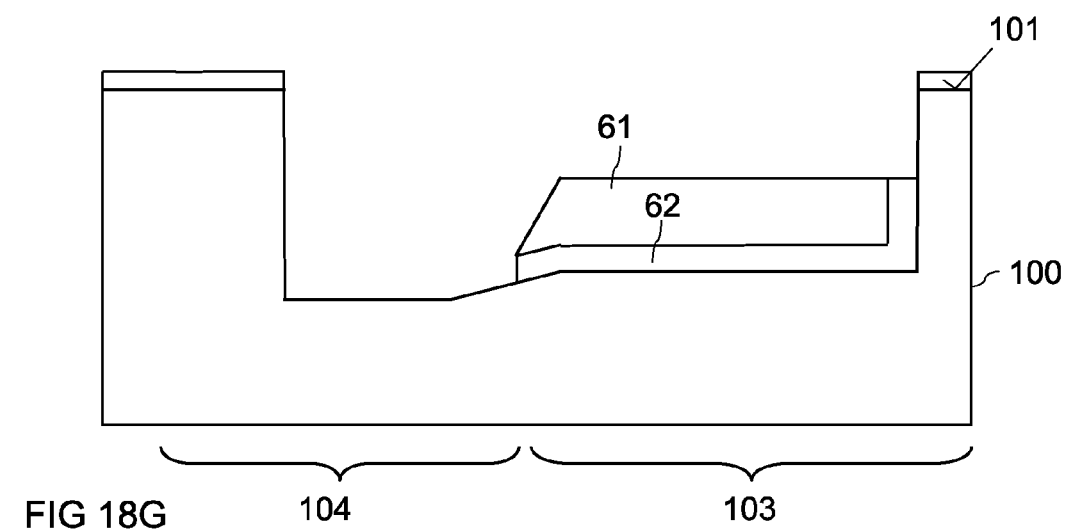

Referring to FIG. 18G, the first dielectric layer 62 and the first electrode layer 61 are etched back such that first dielectric layer 62 and the first electrode layer 61 remain in a lower trench region of the narrower trench section (in the cell region 103), while these layers 62, 61 are completely removed in the wider trench section (in the contact region 104).

Figure 18H:
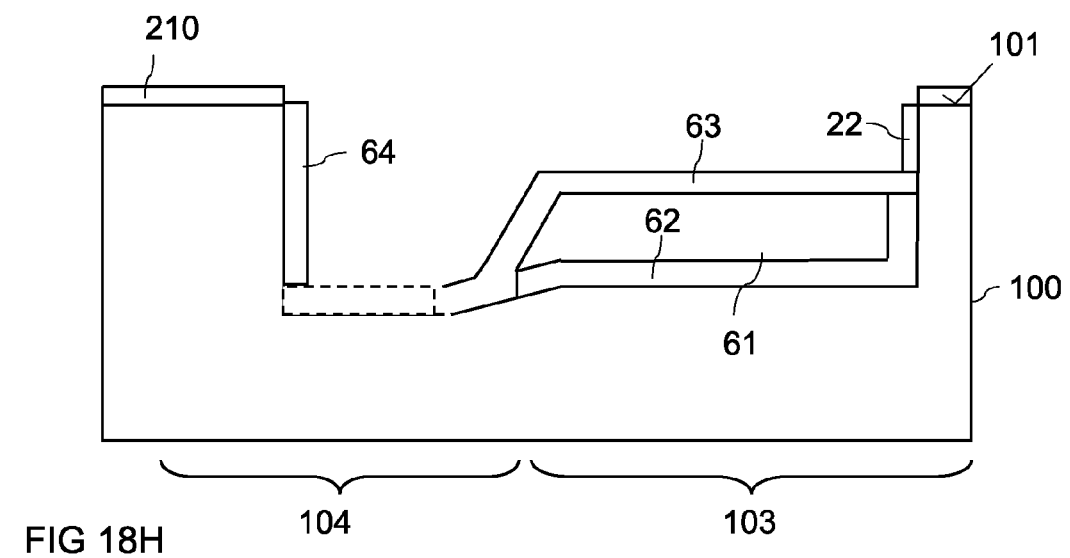

Referring to FIG. 18H, the inter-electrode dielectric layer 63 is formed to cover at least exposed regions of the first electrode layer 61. Forming the inter-electrode dielectric layer 63 on the first electrode layer 61 may include forming the inter-electrode dielectric layer 63 also on the bottom of the wider trench section as illustrated in dashed lines in FIG. 18H. This inter-electrode dielectric layer 63 may remain on the bottom of the wider trench section, or may be removed before forming the gate electrode 21. Referring FIG. 18H, the method further includes forming the gate dielectric on sidewalls of the narrower trench section, and an insulation layer 64 on the sidewalls of the wider trench section. This insulation layer 64 serves to dielectrically insulate the gate electrode that is formed in further process steps from the material of the semiconductor body 100 in the contact region.

Forming the gate dielectric 22 may include a thermal oxidation process as previously explained with reference to FIG. 14I. According to one embodiment, the insulation layer 64 on the sidewalls of the wider trench section is thicker than the gate dielectric 22. Forming the insulation layer 64 may include a thermal oxidation process, but could also include any other conventional process for forming an insulation layer along sidewalls of a trench in a semiconductor body. According to one embodiment, forming the insulation layer 64 includes forming a first partial layer when forming the gate dielectric 22, covering the gate dielectric 22 to prevent a further oxidation in the region of the gate dielectric 22, and forming a second partial layer of the insulation layer 64 by a further thermal oxidation process.

Figure 18I:
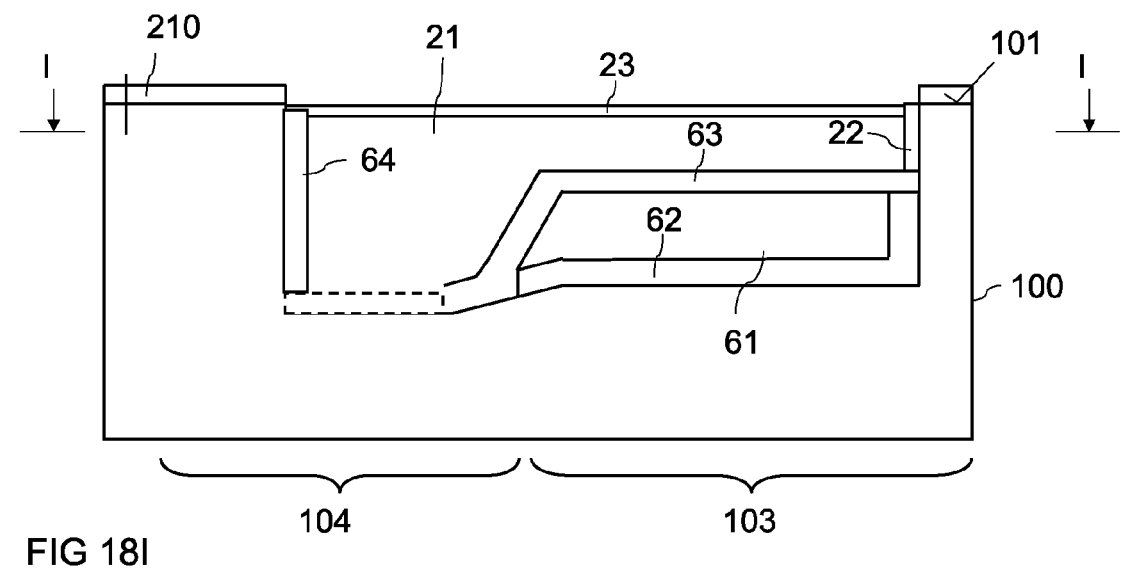

Referring to FIG. 18I, the remaining trench is filled with gate electrode material to form the gate electrode 21 in the cell region 103 and in the contact region 104, whereas in the contact region 104 the gate electrode 21 does not control a conducting channel in the surrounding semiconductor material, but serves to be connected to the gate connection electrode 33 (see FIG. 17). To expose the gate electrode 21 in the connection region 104 on the second surface 102, the semiconductor body 100 is partially removed in a region opposite the first surface 101 until the gate electrode 21 is exposed. The result of this removal process is shown in FIG. 17. The removal process may include conventional techniques known in the art, such as one or more of an etching process and a chemical mechanical polishing (CMP) process. This process may also remove the inter-electrode dielectric 63 that may be left on the bottom of the wider trench section (as illustrated in dashed lines in FIG. 18I).

Figure 18J:
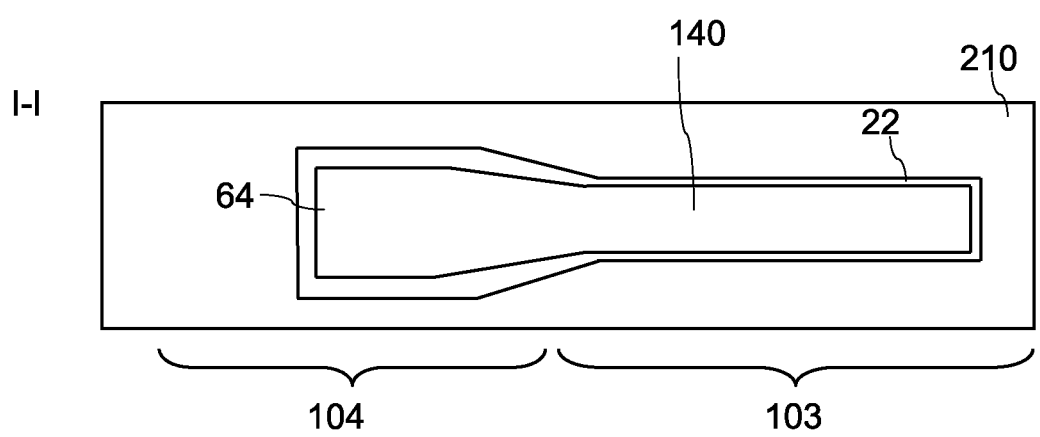

FIG. 18J shows a horizontal cross sectional view of the device shown in FIG. 18I in a section plane I-I cutting through the gate electrode 21 in the cell region 103. Referring to FIG. 18J, in the cell region 103, the gate electrode is dielectrically insulated from the surrounding semiconductor material by the gate dielectric 22. In the contact region 104, the gate electrode 21 is dielectrically insulated from the surrounding semiconductor material by the insulation layer 64.

Like the gate electrode 21 and the field electrode 61 explained before, the field electrode 61 and the gate electrode 21 shown in FIGS. 17 and 18I may include a conventional electrode material, such as polysilicon.

The methods explained with reference to FIGS. 14A to 14J and 18A to 18J are not restricted to producing a field electrode and a gate electrode in a transistor device, but may be used for producing other types of electrodes in a semiconductor body as well. That is, these methods could also be used for producing electrodes that serve as conductors, like the trench electrode 321 explained with reference to FIG. 16.

Figure 19:
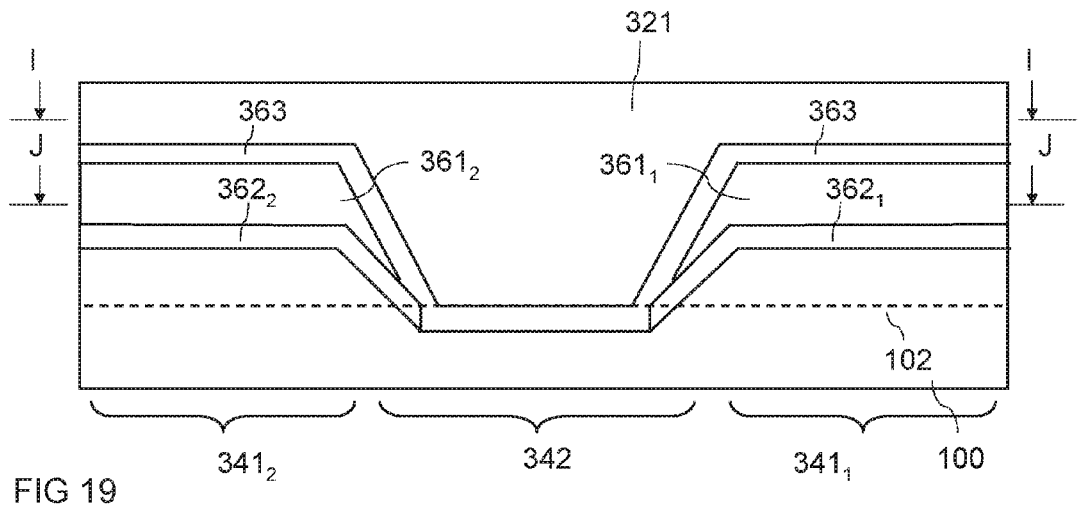
FIG. 19 illustrates a vertical cross sectional of a semiconductor device according to a further embodiment.
Figure 20:
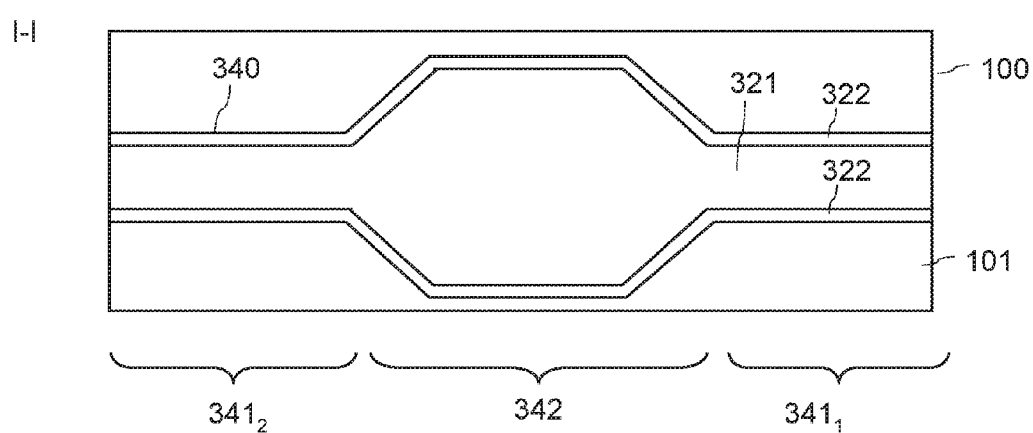
FIG. 20 illustrates a horizontal cross sectional view in a first section plane of the semiconductor device shown in FIG. 19.
Figure 21:
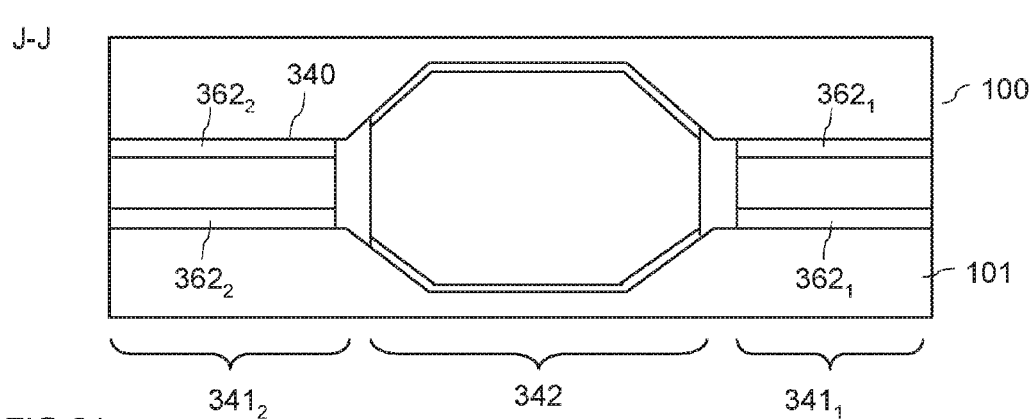
FIG. 21 illustrates a horizontal cross sectional view in a second section plane of the semiconductor device shown in FIG. 19.

FIG. 19 illustrates a vertical cross sectional view of a semiconductor arrangement according to a further embodiment. FIGS. 20 and 21 show horizontal cross sectional views of the semiconductor arrangement shown in FIG. 19 in two different section planes I-I and J-J, respectively.

Referring to FIGS. 19 to 21, the semiconductor arrangement includes a semiconductor body 100 with a trench 340 that includes with two narrow trench sections $341_1$, $341_2$ and a wider trench section 342 between the two narrow trench sections $341_1$, $341_2$. In each of the narrow trench sections $341_1$, $341_2$ a first electrode $361_1$, $361_2$ is arranged and dielectrically insulated from the material of the semiconductor body 100 by a first dielectric layer $362_1$, $362_2$. The two first electrodes $361_1$, $361_2$ terminate in the region of the wider trench section 342 and are spaced apart in a longitudinal direction of the trench 340.

A second electrode 321 is arranged above the first electrodes $361_1$, $361_2$ in the narrow trench sections $341_1$, $341_2$ and dielectrically insulated from the first electrodes $361_1$, $361_2$ by an inter-electrode dielectric layer 363 that also covers a bottom of the wider trench section 342. In the wider trench section 342, the second electrode 321 is arranged above the inter-electrode dielectric layer 363 on the bottom of the wider trench section.

The semiconductor arrangement shown in FIGS. 19 to 21 includes three electrodes, namely the first electrodes $361_1$, $361_2$, and the second electrode 321, each extending in horizontally in the trench 340 in the semiconductor body 100. The first electrodes $361_1$, $361_2$ are buried electrodes arranged between a section of the semiconductor body 100 and the first electrode 321 and the inter-electrode dielectric layer 363. The second electrode 321 is above the first electrodes $361_1$, $361_2$ and may adjoin the first surface 101 of the semiconductor body. In directions perpendicular to the longitudinal direction of the trench 340, material of the semiconductor body 100 is adjacent the first and second electrodes $361_1$, $361_2$, 321 and dielectrically insulated from these electrodes $361_1$, $361_2$, 321.

The first and second electrodes $361_1$, $361_2$, 321 may include a conventional electrically conductive material, such as a metal or a highly doped polycrystalline semiconductor material, e.g. polysilicon.

In a manner not shown in the figures, the individual first electrodes $361_1$, $361_2$, 321 may serve as intra-semiconductor body connectors that electrically connect device structures located at different positions in or above the semiconductor body. These device structures can be integrated in the semiconductor body, such as doped semiconductor regions that are part of a semiconductor device, or can be located above the semiconductor body 100, such as contact electrodes or wire connections. A device structure integrated in the semiconductor body 100 may be connected to one of the electrodes $361_1$, $361_2$, 321 by providing a contact through the corresponding dielectric layer $362_1$, $362_2$, 322. A device structure located above the first surface 101 of the semiconductor body 100 can be connected to the second electrode 321 in the region of the first surface 101, or can be connected to one of the first electrodes $361_1$, $361_2$ through a via (not shown) extending through the second electrode 321 (but not electrically interrupting the second electrode 321 in the longitudinal direction), or through a via extending in the semiconductor body 100 from the first surface 101 adjacent the second electrode 321 down to one of the first and second electrodes $361_1$, $361_2$ and contacting the one of the first electrodes $361_1$, $361_2$ through a contact in the corresponding dielectric layer $362_1$, $362_2$.

Process steps for producing the semiconductor arrangement shown in FIGS. 19 to 21 may correspond to the process steps explained with reference to FIGS. 18A to 18I herein before to which reference is made. The process starts with forming the trench 340 having the two narrower trench sections $341_1$, $341_2$ and the wider trench section 342 and extending deeper into the semiconductor body 100 in the wider trench section 342 than in the narrower trench sections $341_1$, $341_2$. Further process steps for producing the first dielectric layers $362_1$, $362_2$ shown in FIGS. 19 to 21 correspond to the process steps for producing the first dielectric layer 62 explained before, process steps for producing the first electrodes $61_1$, $61_2$ shown in FIGS. 19 to 21 correspond to the process steps for producing the first electrode (field electrode) 61 explained before, process steps for producing the inter-electrode dielectric layer 363 correspond to the process steps for producing the inter-electrode dielectric layer 63 explained before, process steps for producing the second dielectric layer 322 correspond to the process steps for producing the gate dielectric 22 explained before, and process steps for producing the second electrode layer 321 correspond to the process steps for producing the gate electrode 21 explained before. In this method, the first dielectric layers $362_1$, $362_2$ are produced in common process steps, and the first electrodes $361_1$, $361_2$ are produced in common process steps.

In the process for producing the semiconductor arrangement shown in FIGS. 19 to 21, the inter-electrode dielectric 363 remains on the bottom of the wider trench section 342, and the second dielectric layers 322 is produced on the sidewalls of the narrower trench sections $341_1$, $341_2$ above the first electrodes $361_1$, $361_2$ and on the sidewalls of the wider trench section 342. Producing a thicker dielectric layer, similar to dielectric layer 64 as shown in FIG. 18H, on the sidewalls of the wider trench section 342 is optional, but not absolutely necessary.

According to one embodiment (illustrated in dashed lines in FIG. 19), the second electrode 321 is exposed in the region of the second surface 102 of the semiconductor body 100. In this case, the inter-electrode dielectric layer 363 can be removed from the bottom of the wider trench section 342 before producing the second electrode 321, or can be produced in the etching or polishing process that exposes the second electrode 321.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific Figure may be combined with features of other Figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device, the method comprising:
    forming a trench extending from a first surface of a semiconductor body into the semiconductor body such that the trench has a first trench section and at least one second trench section adjoining the first trench section;
    forming, in the at least one second trench section, a first electrode dielectrically insulated from first semiconductor regions of the semiconductor body by a first dielectric layer;
    forming, in the at least one second trench section, an inter-electrode dielectric layer on the first electrode; and
    forming, in the at least one second trench section on the inter-electrode dielectric layer, and in the first trench section, a second electrode, such that the second electrode at least in the first trench section is dielectrically insulated from second semiconductor regions of the semiconductor body by a second dielectric layer,
    wherein the first trench section is wider than the at least one second trench section in plan view of the semiconductor body that is parallel with the first surface, and
    wherein the trench comprises tapered sidewalls connecting two substantially parallel sidewalls of the first trench section to two substantially parallel sidewalls of the at least one second trench section in the plan view.

2. The method of claim 1, wherein the trench is formed such that, in the wider trench section, the trench extends deeper into the semiconductor body than in the narrower trench section.

3. The method of claim 1, further comprising:
    forming the second electrode in the first trench section such that the second electrode is dielectrically insulated from third semiconductor regions of the semiconductor body by a third dielectric layer on the sidewalls of the first trench section.

4. The method of claim 1, further comprising:
forming the inter-electrode dielectric layer on a bottom of the first trench section.

5. The method of claim 1, wherein the trench is formed such that a width of the trench gradually increases from a first width in the at least one second trench section to a second width in the first trench section, wherein the second width is larger than the first width.

6. The method of claim 1, further comprising:
exposing a section of the second electrode arranged in the first trench section on a second surface opposite the first surface of the semiconductor body.

7. The method of claim 1, wherein forming the trench comprises forming two second trench sections adjoining the first trench section on opposite sides.

8. The method of claim 1, wherein forming the first electrode in the at least one second trench section comprises:
forming the first dielectric layer on a bottom of the at least one second trench section and on sidewalls at least in a lower portion of the at least one second trench section;
forming a first electrode layer in the first trench section and the at least one second trench section such that the first electrode layer leaves a residual trench in the first trench section and completely fills the trench in the at least one second trench section;
removing the first electrode layer in the first trench section; and
partially removing the first electrode layer in the at least one second trench section such that the first electrode layer remains in the lower portion of the at least one second trench section.

9. The method of claim 1, further comprising:
forming a third dielectric layer on the sidewalls of the first trench section after forming the inter-electrode dielectric layer.

10. The method of claim 9, wherein at least a part of the third dielectric layer is formed simultaneously while forming the second dielectric layer.

11. The method of claim 1, further comprising:
forming, in the semiconductor body, a body region adjacent the second dielectric layer in the at least one second trench section;

forming a source region in the body region and adjacent the second dielectric layer.

12. The method of claim 1, further comprising:
electrically connecting a first device structure to the first electrode at a first position of the first electrode, and a second device structure to the first electrode at a second position distant to the first position of the first electrode;
electrically connecting a third device structure to the second electrode at a first position of the second electrode, and a fourth device structure to the first electrode at a second position distant to the first position of the second electrode.

13. The method of claim 12, wherein at least one of the first device structure, the second device structure, the third device structure, and the fourth device structure, is selected from one of:
a doped semiconductor region;
an electrically conducting contact; and
a connection line.

14. A method for producing a semiconductor device, the method comprising:
forming a trench extending from a first surface of a semiconductor body into the semiconductor body such that the trench has a first trench section and at least one second trench section adjoining the first trench section, and wherein the trench is wider in the first trench section than in the second trench section;
forming, in the at least one second trench section, a first electrode dielectrically insulated from first semiconductor regions of the semiconductor body by a first dielectric layer;
forming, in the at least one second trench section, an inter-electrode dielectric layer on the first electrode; and
forming, in the at least one second trench section on the inter-electrode dielectric layer, and in the first trench section, a second electrode, such that the second electrode at least in the first trench section is dielectrically insulated from second semiconductor regions of the semiconductor body by a second dielectric layer, wherein the trench is formed such that, in the wider trench section, the trench extends deeper into the semiconductor body than in the narrower trench section.

* * * * *